United States Patent
Ito et al.

(10) Patent No.: US 10,816,608 B2
(45) Date of Patent: Oct. 27, 2020

(54) MONITORING DEVICE

(71) Applicant: DENSO CORPORATION, Kariya, Aichi-pref. (JP)

(72) Inventors: Masahiko Ito, Kariya (JP); Hayato Mizoguchi, Kariya (JP)

(73) Assignee: DENSO CORPORATION, Kariya (JP)

(*) Notice: Subject to any disclaimer, the term of this patent is extended or adjusted under 35 U.S.C. 154(b) by 90 days.

(21) Appl. No.: 16/049,297

(22) Filed: Jul. 30, 2018

(65) Prior Publication Data
US 2019/0033387 A1    Jan. 31, 2019

(30) Foreign Application Priority Data
Jul. 28, 2017 (JP) .................. 2017-146906

(51) Int. Cl.
| | |
|---|---|
| *G01R 31/396* | (2019.01) |
| *H05K 1/18* | (2006.01) |
| *H05K 1/02* | (2006.01) |
| *H01M 10/48* | (2006.01) |
| *H01M 10/42* | (2006.01) |
| *H01M 2/34* | (2006.01) |
| *H01M 2/20* | (2006.01) |
| *G01R 19/165* | (2006.01) |

(52) U.S. Cl.
CPC ........ *G01R 31/396* (2019.01); *H01M 10/425* (2013.01); *H01M 10/4257* (2013.01); *H01M 10/482* (2013.01); *H05K 1/028* (2013.01); *H05K 1/181* (2013.01); *G01R 19/16542* (2013.01); *H01M 2/206* (2013.01); *H01M 2/348* (2013.01); *H01M 2200/103* (2013.01); *H05K 2201/055* (2013.01); *H05K 2201/10037* (2013.01); *H05K 2201/10151* (2013.01)

(58) Field of Classification Search
None
See application file for complete search history.

(56) References Cited

U.S. PATENT DOCUMENTS

| | | |
|---|---|---|
| 2013/0342939 A1 | 12/2013 | Itou et al. |
| 2018/0219204 A1 | 8/2018 | Takase et al. |
| 2018/0358820 A1 | 12/2018 | Mizoguchi |

FOREIGN PATENT DOCUMENTS

JP    2014-228302 A    12/2014

*Primary Examiner* — Daniel S Gatewood
(74) *Attorney, Agent, or Firm* — Oliff PLC

(57) ABSTRACT

A monitoring device includes a monitoring section and a wiring section for electrically connecting the monitoring section and a battery cell. A first and a second electrode terminal groups are reversely arranged. The wiring section includes a first wiring section for electrically connecting the first electrode terminal group and the monitoring section, and a second wiring section for electrically connecting the second electrode terminal group and the monitoring section. The first wiring section has a first substrate and a first wiring pattern, and the second wiring section has a second substrate and a second wiring pattern. The second substrate has a lateral connecting space where a first end side of the second wiring pattern is disposed and a longitudinal connecting space where a second end side of the second wiring pattern is disposed, and the second substrate is bent such that the spaces are opposed to each other.

10 Claims, 22 Drawing Sheets

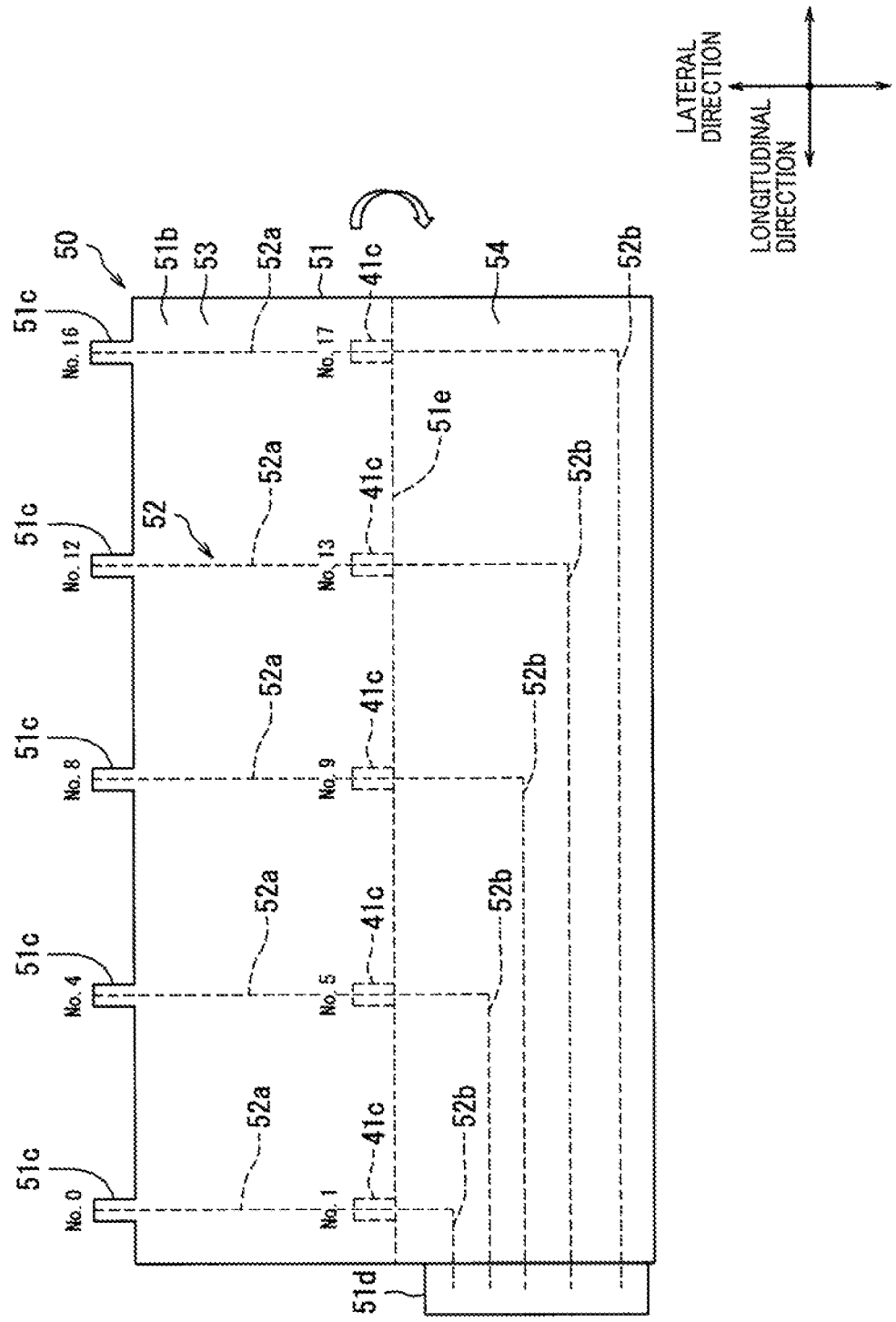

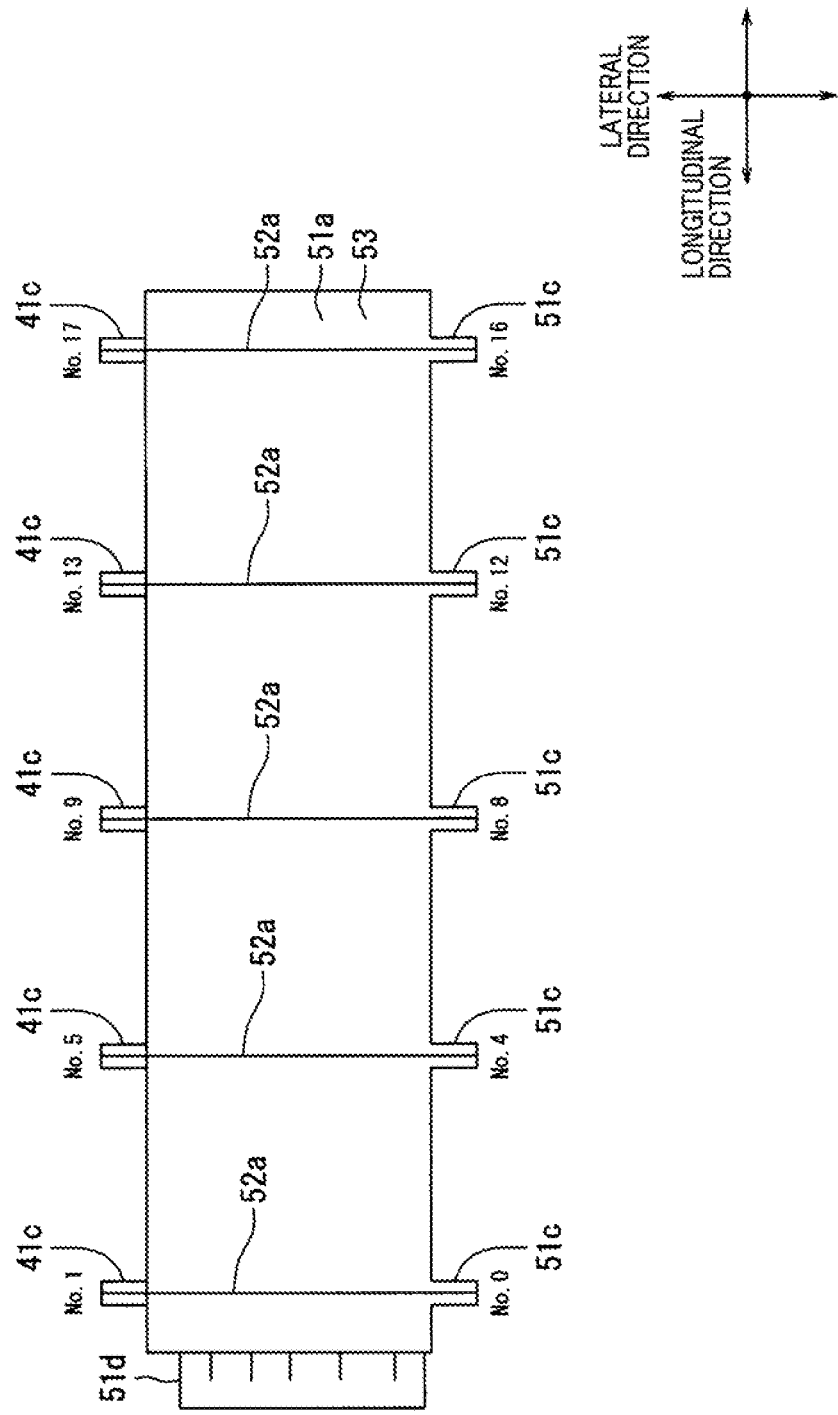

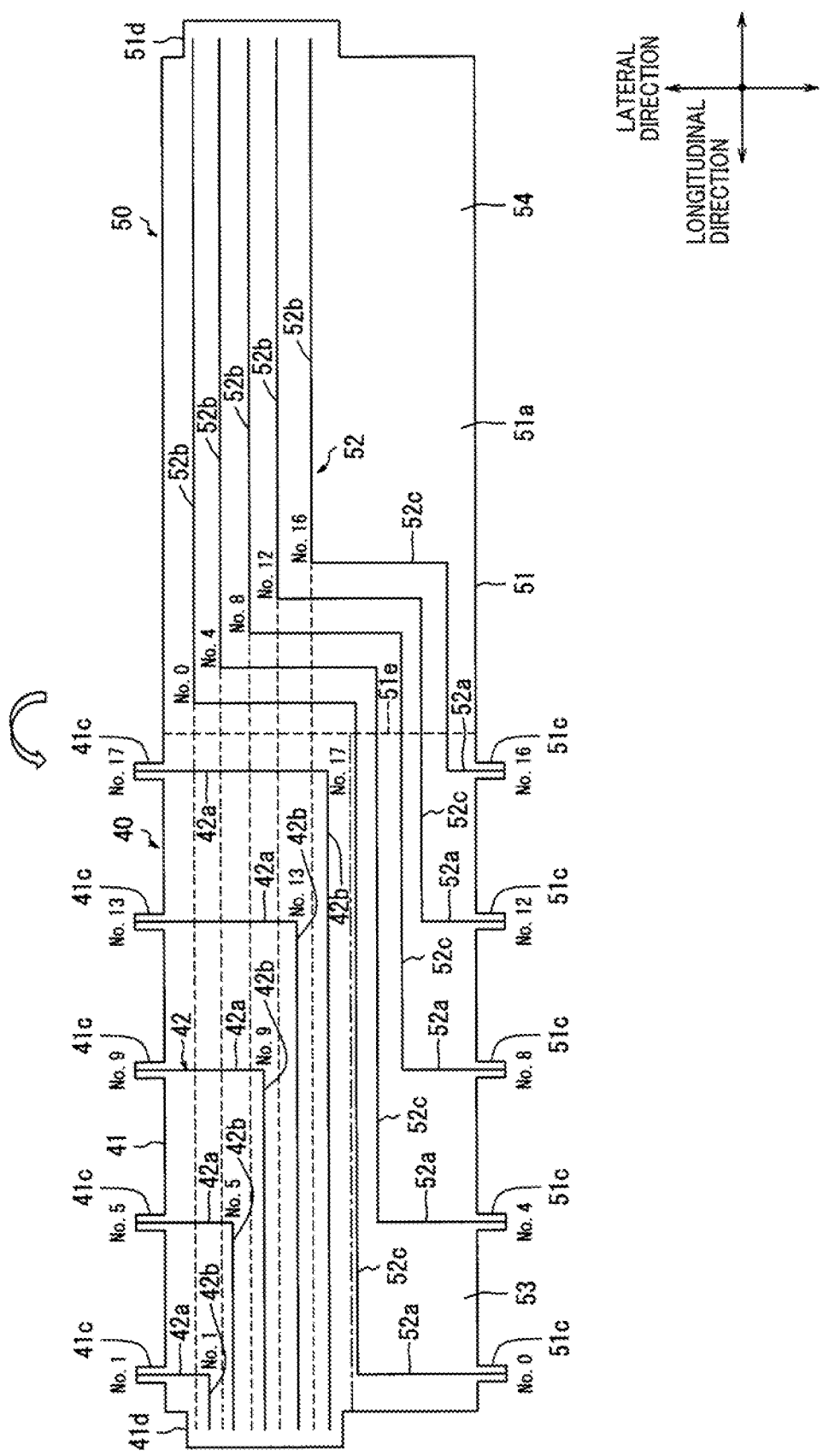

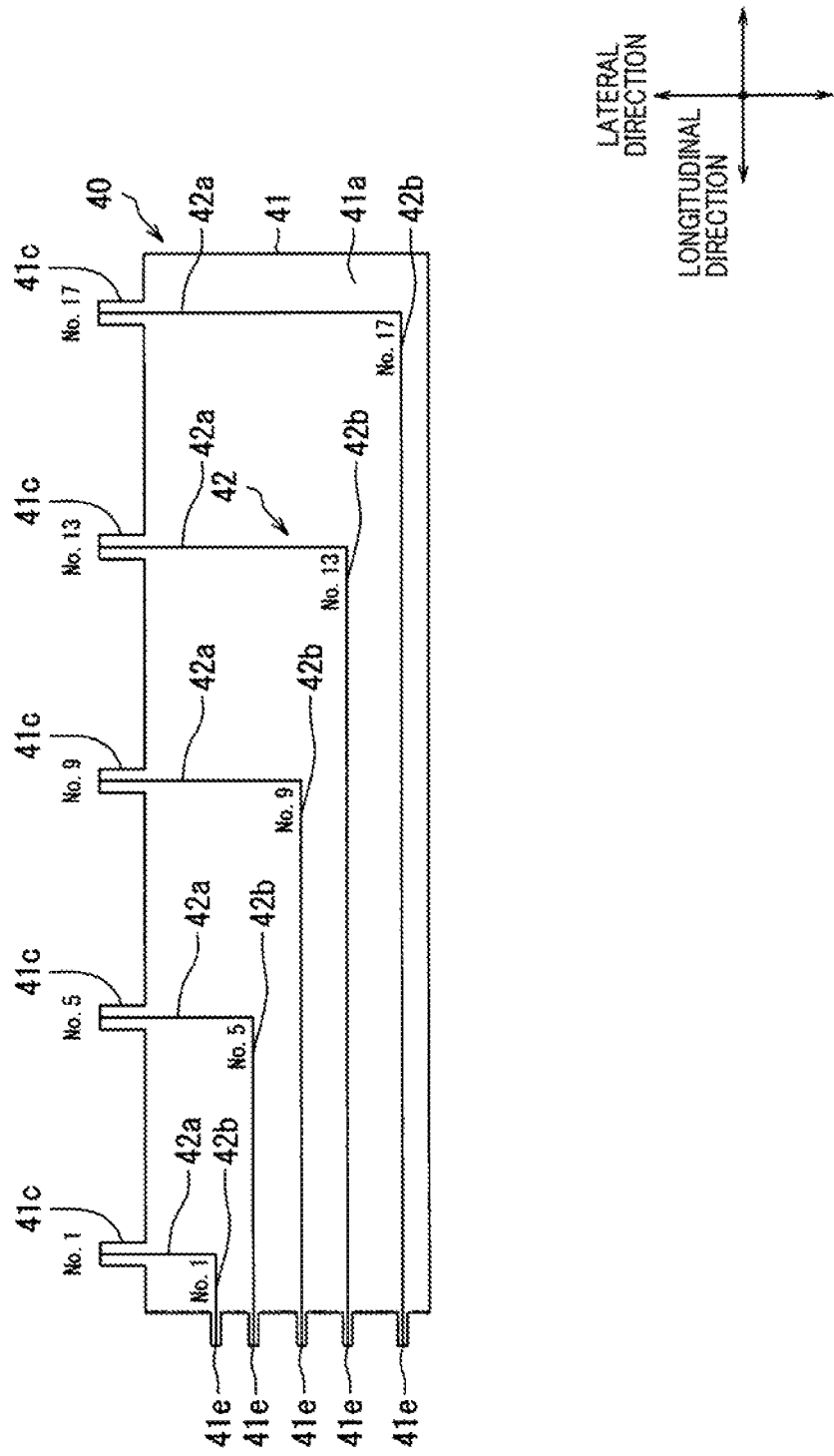

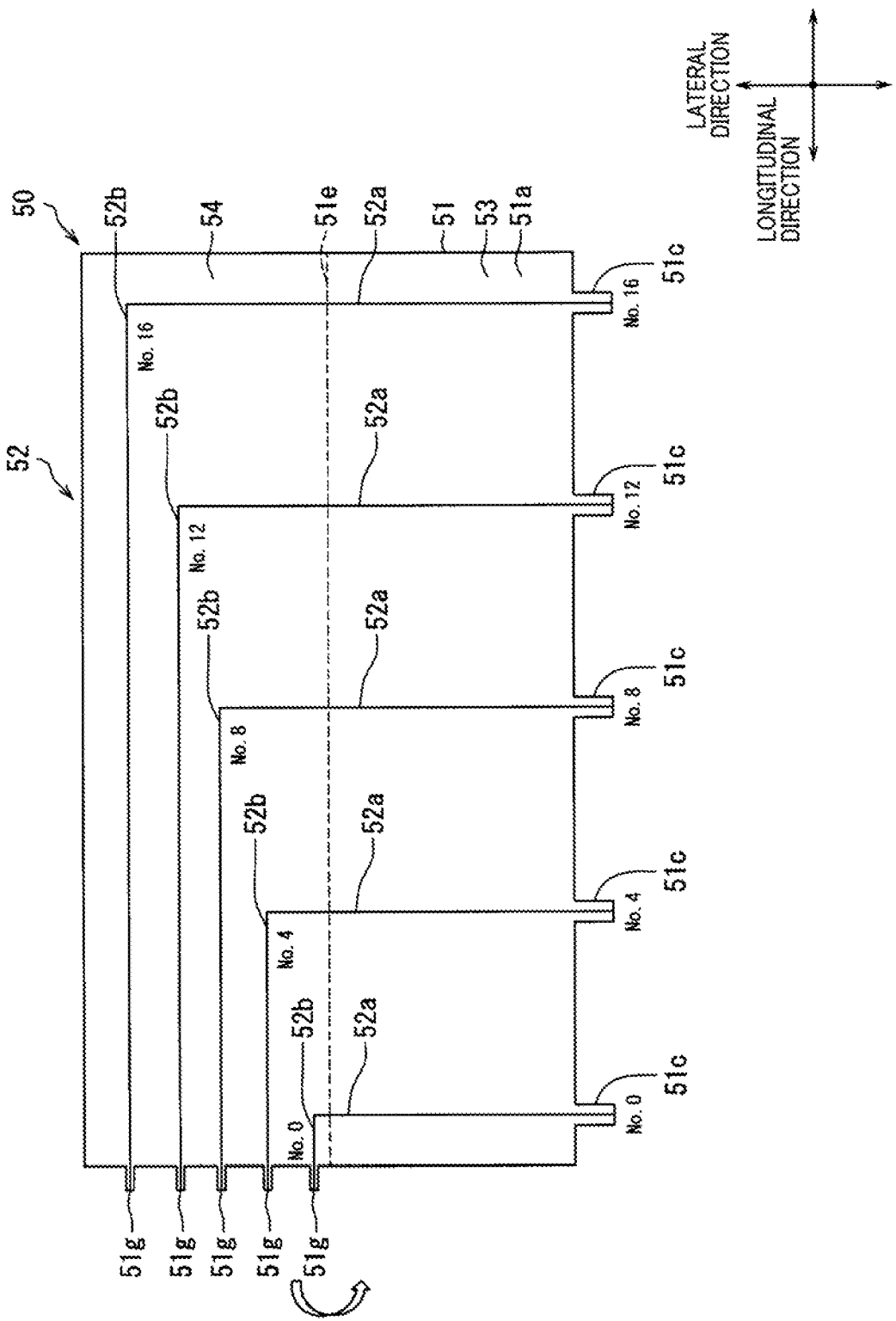

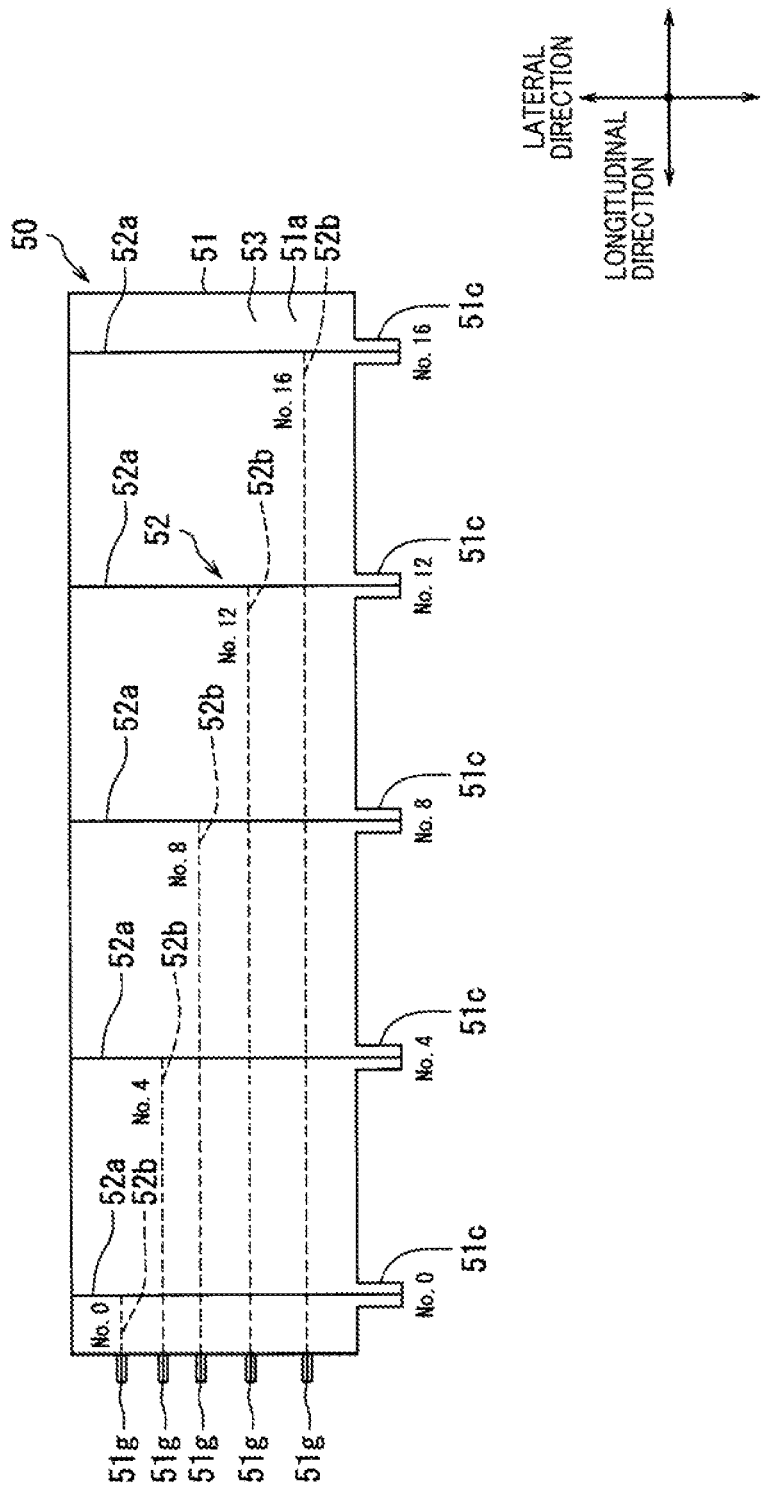

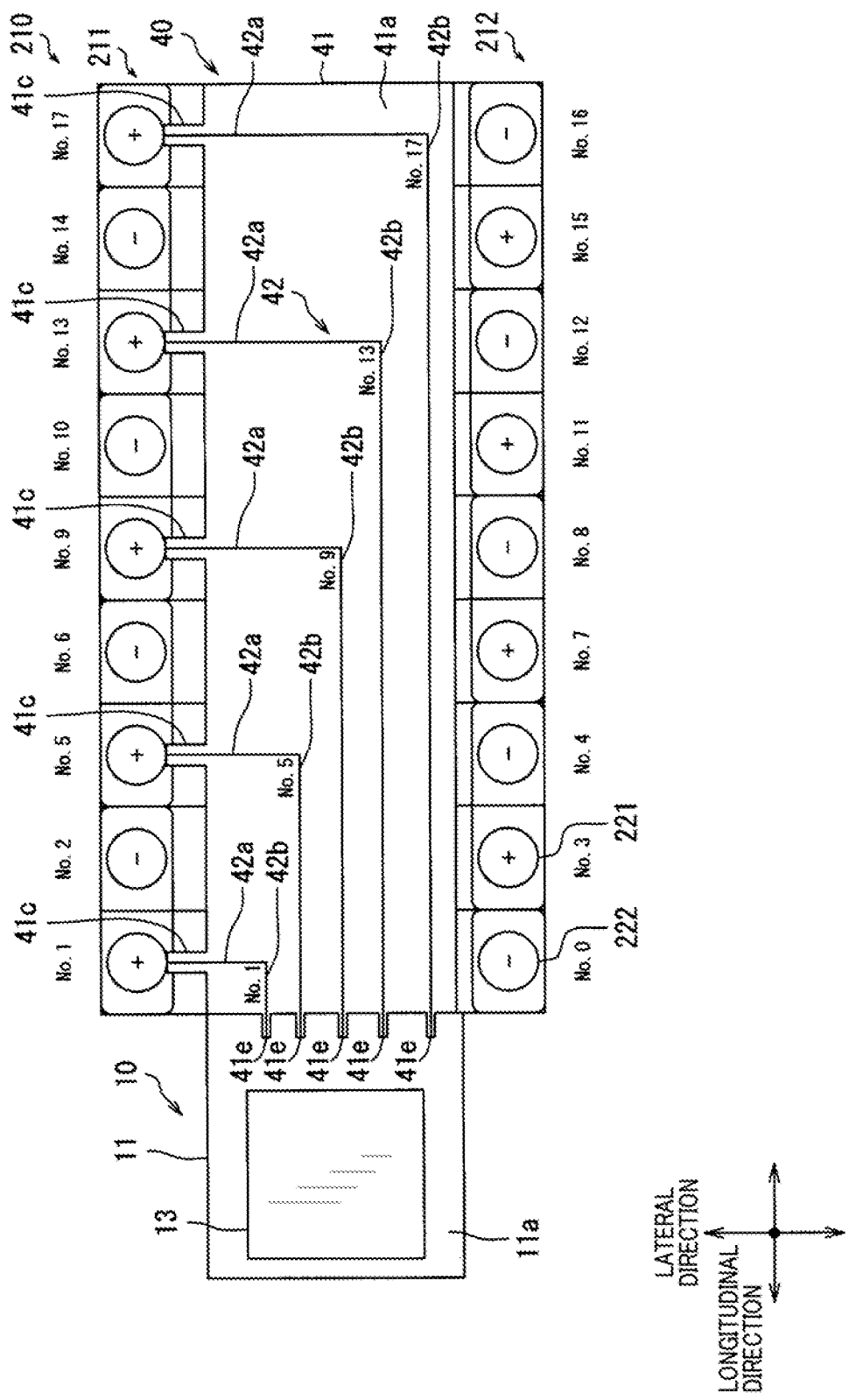

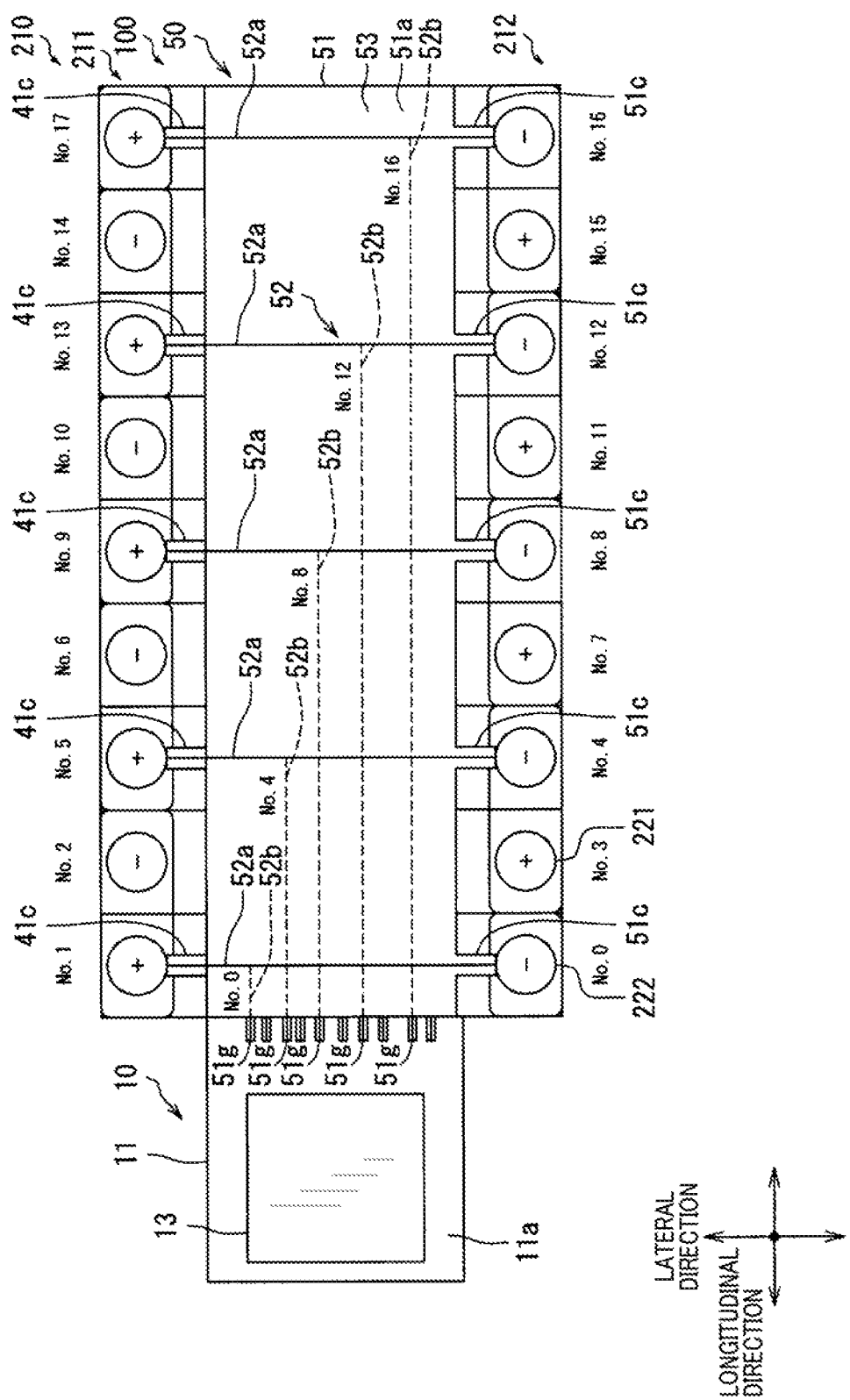

MONITORING DEVICE

CROSS-REFERENCE TO RELATED APPLICATION

This application is based on and claims the benefit of priority from earlier Japanese Patent Application No. 2017-146906 filed Jul. 28, 2017, the description of which is incorporated herein by references.

TECHNICAL FIELD

The present disclosure relates to a battery cell monitoring device.

BACKGROUND

A battery module having a cell group in which a plurality of unit cells are arranged side by side and two battery wiring modules attached to the cell group as disclosed in Japanese Patent Application Laid-Open Publication No. 2017-27831 (Patent Document 1) is known.

Each of the two battery wiring modules includes a plurality of bus bars, flexible printed circuit substrates, and connectors. The flexible printed circuit substrate includes a plurality of voltage detection wirings for detecting the voltage of each unit cell. The plurality of voltage detection wirings connect the bus bars and the connectors. The connectors are connected to a battery ECU.

A power supply system having a battery pack and a battery monitoring device as disclosed in Japanese Patent Application Laid-Open Publication No. 2014-7883 (Patent Document 2) is known. The battery pack is formed with a plurality of battery cells composed of secondary batteries connected in series.

The battery monitoring device is a device that monitors the battery pack by detecting various states such as the voltage of the battery pack. The battery monitoring device is connected to both terminals of each battery cell of the battery pack via detection lines or the like for voltage detection.

The battery monitoring device includes a circuit protection section and a plurality of monitoring circuits. The circuit protection section is provided with an overvoltage protection element. The overvoltage protection element is connected between each detection line and maintains the voltage applied to the monitoring circuit at a constant voltage.

In Patent Document 1, the plurality of unit cells are disposed so that electrode terminal groups in which a plurality of electrode terminals are arranged are formed on the left side and the right side, for example, of the battery module.

One of the bus bars of the two battery wiring modules is connected to the left-side electrode terminal group. Another one of the bus bars of the two battery wiring modules is connected to the right-side electrode terminal group.

Therefore, one of the bus bars and the other one of the bus bars of the two bus wiring modules are connected to one of the terminals of each cell. Along with this, each of the flexible printed circuit substrate of the two battery wiring modules is provided with one of the voltage detection wirings connected to the terminals of each cell.

Therefore, in order to provide an overvoltage protection element shown in Patent Document 2, for example, in the configuration described in Patent Document 1, a wiring layout must be changed in the battery ECU side connected to the voltage detection wirings via the connectors such that the detection lines are arranged in order of potential.

There is a possibility that the size of the battery ECU (monitoring section) will increase by securing a space for changing the wiring layout.

SUMMARY

An embodiment provides a monitoring device that suppresses a size of a monitoring section from increasing.

One aspect of the present disclosure is a monitoring device including a monitoring section that monitors voltages of a plurality of battery cells connected in series in a longitudinal direction, and a wiring section for electrically connecting the monitoring section and the battery cells.

Each of the plurality of battery cells has a positive electrode terminal and a negative electrode terminal, a first electrode terminal group in which the positive electrode terminals and the negative electrode terminals are alternately arranged by arranging the positive electrode terminals and the negative electrode terminals alternately in the longitudinal direction, and a second electrode terminal group in which an arrangement of the positive electrode terminals and the negative electrode terminals are reversed with respect to the first electrode terminal group.

The wiring section includes a first wiring section that electrically connects the first electrode terminal group and the monitoring section, and a second wiring section that electrically connects the second electrode terminal group and the monitoring section. The first wiring section includes a first substrate and a first wiring pattern formed on the first substrate, and the second wiring section includes a second substrate and a second wiring pattern formed on the second substrate.

The second substrate includes a lateral connecting space where a first end side of the second wiring pattern is disposed and a longitudinal connecting space where a second end side of the second wiring pattern is disposed, and the second substrate is bent such that the lateral connecting space and the longitudinal connecting space are opposed to each other.

Although details will be described in embodiments, due to the arrangement of the positive electrode terminal and the negative electrode terminal, when the second ends of the first wiring pattern are arranged from a low potential to a high potential, for example, the second ends of the second wiring pattern will be arranged from the high potential to the low potential.

In this way, the potential arrangements are reversed between the second ends of the first wiring pattern and the second ends of the second wiring pattern.

In contrast, in the present disclosure, the lateral connecting space and the longitudinal connecting space are bent so as to face each other. As a result, the arrangement of the second wiring pattern can be changed.

Therefore, the second ends of the second wiring pattern can be arranged, for example, from a low potential to a high potential similarly to the second ends of the first wiring pattern.

As described above, unlike a configuration in which the order of the potentials of the second ends of the first wiring pattern and the second ends of the second wiring pattern is reversed, it is not necessary to change the wiring layout so that the wirings are arranged in order of potentials in the monitoring section.

Therefore, it is not necessary for the monitoring section to have a space for changing the wiring layout. As a result, the size of the monitoring section is suppressed from increasing.

BRIEF DESCRIPTION OF THE DRAWINGS

In the accompanying drawings:

FIG. 15 shows a top view in a state where the wiring section shown in FIG. 14 is bent once;

FIG. 16 shows a top view in a state where the wiring section shown in FIG. 14 is bent twice;

FIG. 17 shows a top view of a wiring section of a third embodiment;

FIG. 18 shows a top view of a first wiring section of a fourth embodiment;

FIG. 19 shows a top view of a second wiring section of the fourth embodiment;

FIG. 20 shows a top view in a state where the second wiring section shown in FIG. 19 is bent;

FIG. 21 shows a top view in a state where the first wiring section and a monitoring section are disposed on a battery stack; and FIG. 22 shows a top view in a state where a monitoring device is disposed on the battery stack.

DETAILED DESCRIPTION OF THE PREFERRED EMBODIMENTS

Hereinafter, embodiments will be described with reference to the drawings.

First Embodiment

A battery pack monitoring device according to the present embodiment will be described with reference to FIGS. 1 to 12. A battery pack of the present embodiment is applied to a hybrid vehicle.

Hereinafter, three directions orthogonal to each other are indicated as a lateral direction, a longitudinal direction, and a vertical direction. In the present embodiment, the lateral direction of the battery pack is along an advancing and retreating direction of the hybrid vehicle. The longitudinal direction of the battery pack is along a left-right direction of the hybrid vehicle. The vertical direction of the battery pack is along a top-bottom direction of the hybrid vehicle.

Overview of Battery Pack

A battery pack 400 functions to supply power to an electric load of a hybrid vehicle. The electric load includes a motor generator that functions as a power supply source and a power generation source.

For example, when the motor generator runs on battery power, the battery pack 400 discharges and supplies power to the motor generator. When the motor generator generates power, the battery pack 400 is charged with the power generated by the power generation.

The battery pack 400 has a battery ECU 300. The battery ECU 300 is electrically connected to various ECUs (in-vehicle ECUs) mounted in the hybrid vehicle. The battery ECU 300 and in-vehicle ECU mutually transmit and receive signals to cooperatively control the hybrid vehicle.

Figure 2:
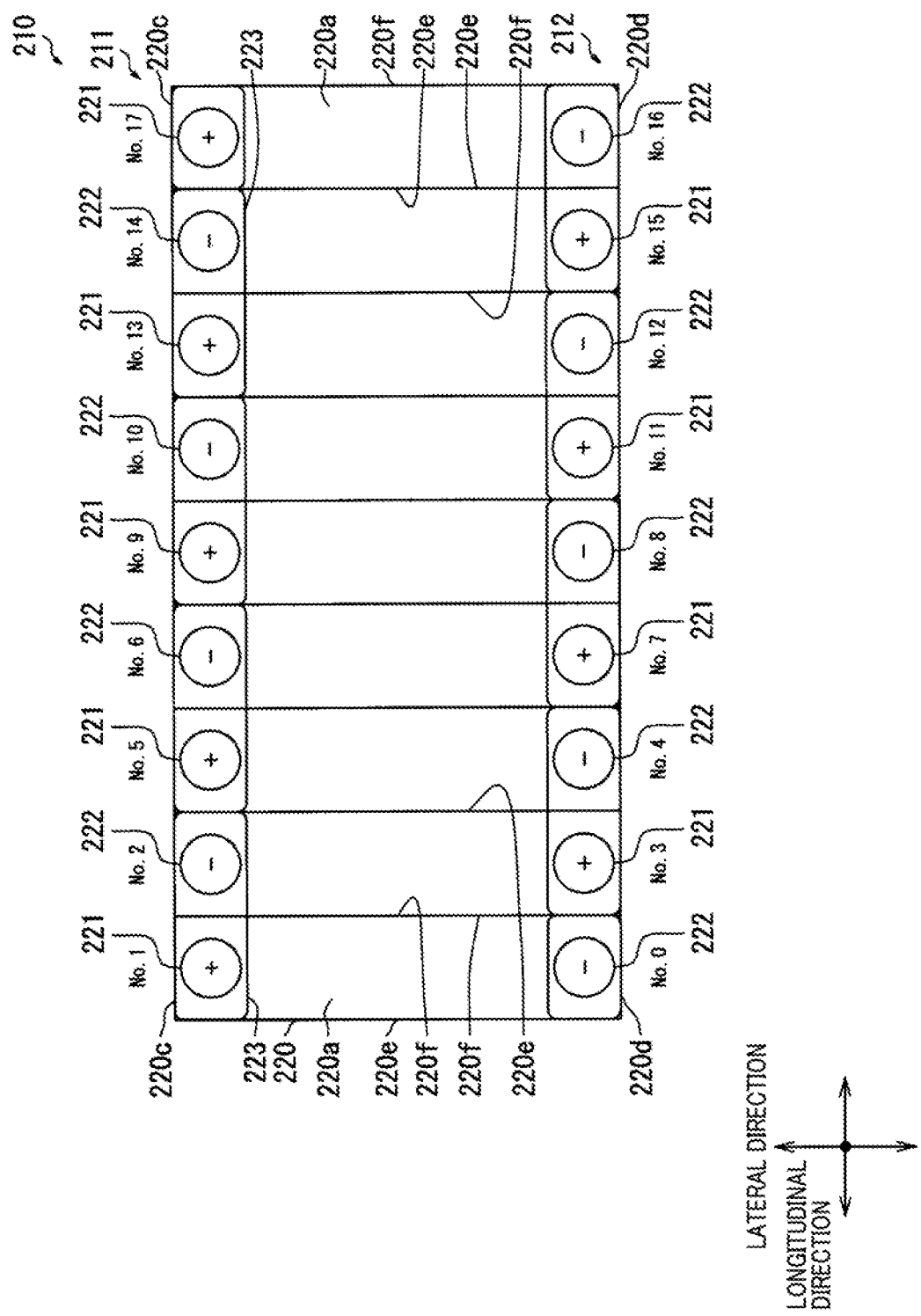
FIG. 2 shows a top view of a battery stack.

The battery pack 400 has a battery module 200. As shown in FIG. 2, the battery module 200 has a battery stack 210 in which a plurality of battery cells 220 are electrically and mechanically connected in series.

The battery pack 400 has a monitoring device 100. The monitoring device 100 monitors the voltage of each battery cell 220 constituting the battery stack 210.

As described above, the battery pack 400 includes the monitoring device 100, the battery module 200, and the battery ECU 300.

Besides these, the battery pack 400 may have a blower fan for cooling the battery module 200. Driving of the blower fan is controlled by the battery ECU 300.

The battery pack 400 is disposed in, for example, a space under a seat of the hybrid vehicle. This space is wider under a rear seat than under a front seat. The battery pack 400 of the present embodiment is disposed in a space under the rear seat.

It should be noted that a location at which the battery pack 400 is disposed is not limited to this, and between the rear seat and a trunk, between a driver's seat and a passenger seat, or the like can be appropriately adopted, for example.

Hereinafter, the battery module 200 and the monitoring device 100 will be described.

Overview of Battery Module

As shown in FIG. 2, the battery module 200 has a battery stack 210. Further, although not shown, the battery module 200 has a casing that accommodates the battery stack 210. The casing is formed by aluminum die casting. The casing has a box shape opening in the vertical direction and having a bottom. The opening of the casing is covered with a lid.

A flow path through which cooling air flows is formed inside the casing. At least one of the casing and the lid is formed with a communication hole for communicating the external atmosphere with the flow path.

It should be noted that the material for forming the casing is not limited to the above example. For example, iron or stainless steel can be adopted as the material for forming the casing. Alternatively, the casing may be manufactured by pressing iron or stainless steel.

The battery stack 210 has a plurality of battery cells 220. The plurality of battery cells 220 are arranged in the longitudinal direction. The plurality of battery cells 220 are electrically and mechanically connected in series. Therefore, an output voltage of the battery module 200 is the sum of output voltages of the plurality of battery cells 220.

Overview of Monitoring Device

Figure 1:
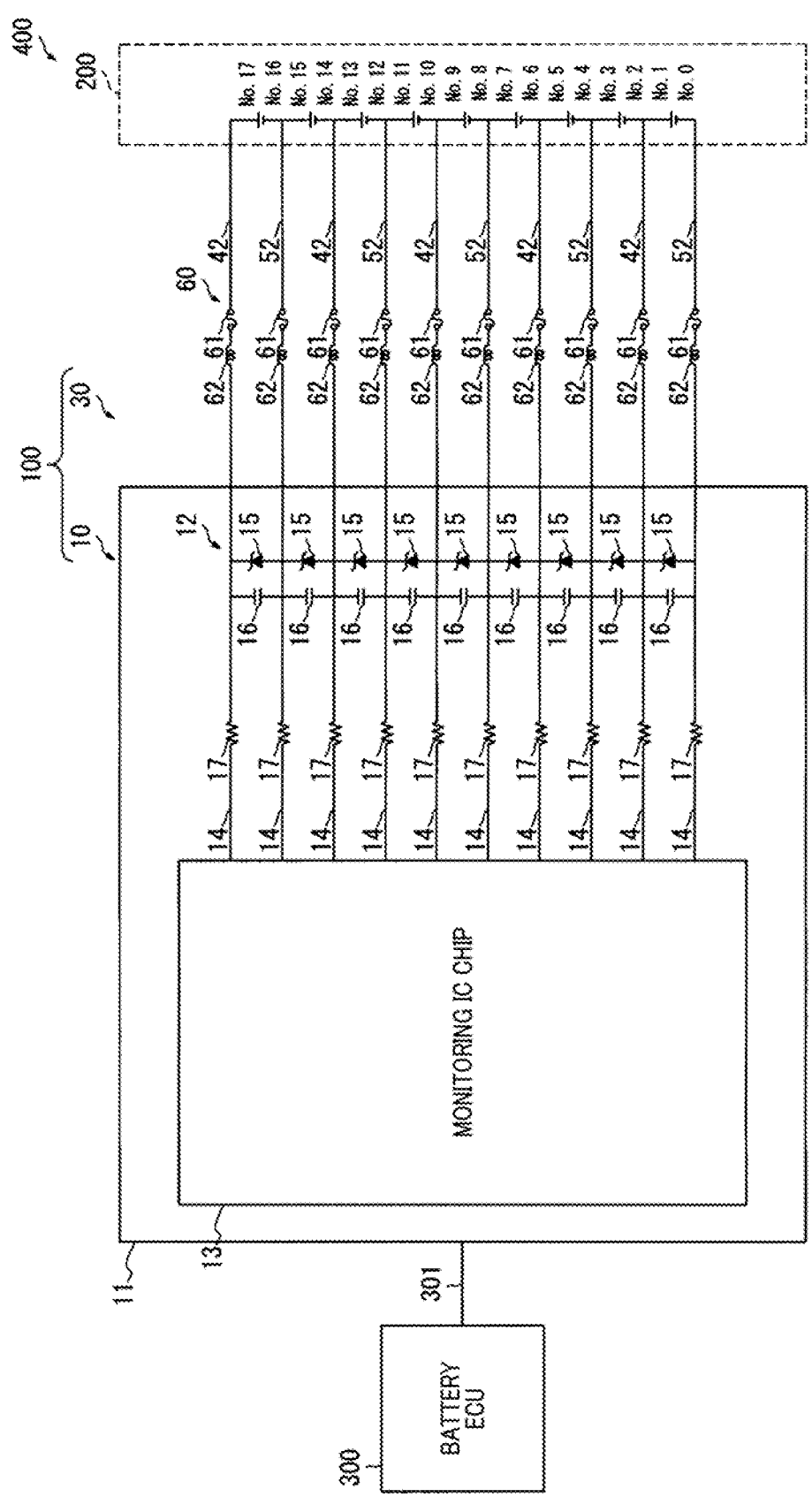
FIG. 1 shows a circuit diagram of a battery pack.

As shown in FIG. 1, the monitoring device 100 includes a monitoring section 10 that monitors voltages of a plurality of battery cells 220, and a wiring section 30 that electrically connects the monitoring section 10 and the respective battery cells 220.

Each of the monitoring section 10 and the wiring section 30 is disposed in the battery module 200. Specifically, the monitoring section 10 is disposed above or lateral side of the battery stack 210.

The wiring section 30 is disposed above the battery stack 210. The wiring section 30 connects at least one of positive electrode terminals 221 and negative electrode terminals 222 of the plurality of battery cells 220 of the battery stack 210 to the monitoring section 10.

Structure of Battery Stack

Next, the battery stack 210 will be described in detail with reference to FIG. 2.

As described above, the battery stack 210 has the plurality of battery cells 220. The battery cell 220 has a quadrangular prism shape. Therefore, the battery cell 220 has six surfaces.

The battery cell 220 has an upper surface 220a facing in the vertical direction. Further, the battery cell 220 has a lower surface facing in the vertical direction, though not shown.

The battery cell 220 has a first side surface 220c and a second side surface 220d that face in a lateral direction. The battery cell 220 has a first main surface 220e and a second main surface 220f facing in the longitudinal direction.

Among these six surfaces, the first main surface 220e and the second main surface 220f are larger in area than the other surfaces.

The battery cell 220 is a secondary battery. Specifically, the battery cell 220 is a lithium ion battery. Lithium ion batteries generate induced voltage by chemical reaction. Current flows through the battery cell 220 by an induced voltage being generated. As a result, the battery cell 220 generates heat. The battery cell 220 expands as well.

As described above, the areas of the first main surface 220e and the second main surface 220f of the battery cell 220 are larger than those of the other surfaces.

Therefore, in the battery cell 220, the first main surface 220e and the second main surface 220f are easily expanded.

As a result, the battery cell 220 expands in the longitudinal direction. That is, the battery cell 220 expands in the direction in which the plurality of battery cells 220 are arranged.

The battery stack 210 has a restrainer (not shown). By means of this restrainer, the plurality of battery cells 220 are mechanically connected in series in the longitudinal direction.

In addition, this restrainer suppresses the size of each of the first battery stack 210 from increasing due to the expansion of each of the plurality of battery cells 220.

It should be noted that gaps are formed between adjacent battery cells 220. Heat dissipation of each battery cell 220 is promoted as air passes through these gaps.

The positive electrode terminal 221 and the negative electrode terminal 222 are formed on the upper surface 220a of the battery cell 220. The positive electrode terminal 221 and the negative electrode terminal 222 are arranged in the lateral direction. The positive terminal 221 is positioned near the first side surface 220c. The negative terminal 222 is positioned near the second side surface 220d.

As shown in FIG. 2, two adjacent battery cells 220 are opposed to each other between the respective first main surface 220e and the second main surface 220f. Thereby, one positive electrode terminal 221 and the other negative electrode terminal 222 of two adjacent battery cells 220 are aligned in the longitudinal direction.

As a result, the positive electrode terminals 221 and the negative electrode terminals 222 are alternately aligned in the longitudinal direction in the battery stack 210.

The battery stack 210 is configured to have a first electrode terminal group 211 in which the positive electrode terminals 221 and the negative electrode terminals 222 are alternately aligned in the longitudinal direction and a second electrode terminal group 212 in which the negative electrode terminals 222 and the positive electrode terminals 221 are alternately aligned in the longitudinal direction.

In the first electrode terminal group 211 and the second electrode terminal group 212, the alignments of the positive electrode terminals 221 and the negative electrode terminals 222 are opposite.

The first electrode terminal group 211 and the second electrode terminal group 212 are arranged in the lateral direction.

Among the electrode terminals constituting the first electrode terminal group 211 and the second electrode terminal group 212, one positive electrode terminal 221 and one negative electrode terminal 222 arranged side by side in the longitudinal direction are connected to a series terminal 223 extending in the longitudinal direction. As a result, the plurality of battery cells 220 constituting the battery stack 210 are electrically connected in series.

The battery stack 210 of the present embodiment has nine battery cells 220. These nine battery cells 220 are connected in series. Therefore, the total number of the positive electrode terminals 221 and the negative electrode terminals 222 is eighteen.

As shown in FIG. 1 and FIG. 2, these eighteen electrode terminals are numbered such that the number increases as going from the lowest potential to the highest potential.

As the number of numbers (No.) shown in the figure increases, the potential (voltage) of the electrode terminal increases.

In FIG. 2, a negative electrode terminal 222 of the battery cell 220 denoted as No. 0 is at the ground potential (the lowest potential). A positive terminal 221 of the battery cell 220 denoted as No. 17 is the potential obtained by summing the outputs of the respective battery cells 220 (the highest potential).

The negative electrode terminal 222 having the lowest potential and the positive electrode terminal 221 having the highest potential are connected to the electrical load. As a result, the potential difference between the lowest potential and the highest potential is outputted to the electrical load as the output voltage of the battery module 200.

As a matter of course, the number of the battery cells 220 of the battery stack 210 is not limited to the above example as long as the number is plural. The battery stack 210 may have an even number of battery cells 220.

Configuration of Monitoring Device

Next, the monitoring device 100 will be described in detail with reference to FIGS. 1 to 12.

As described above, the monitoring device 100 has the monitoring section 10 and the wiring section 30.

As shown in FIG. 1, the monitoring section 10 has a printed circuit substrate 11, first electronic elements 12, and a monitoring IC chip 13. The first electronic elements 12 and the monitoring IC chip 13 are mounted on the printed circuit substrate 11. The first electronic elements 12 and the monitoring IC chip 13 are electrically connected via substrate wirings 14 of the printed circuit substrate 11.

The wiring section 30 is connected to the printed circuit substrate 11 of the monitoring section 10. Thereby, the battery stack 210 and the monitoring section 10 are electrically connected via the wiring section 30.

Note that a connector (not shown) is provided on the printed circuit substrate 11 of the monitoring section 10. A wire 301 is connected to this connector. This wire 301 is connected to the battery ECU 300. As a result, the monitoring section 10 is connected to the battery ECU 300.

The wiring section 30 has a first wiring section 40 and a second wiring section 50. The first wiring section 40 corresponds to the first electrode terminal group 211. The first wiring section 40 electrically connects the first electrode terminal group 211 and the monitoring section 10.

The second wiring section 50 corresponds to the second electrode terminal group 212. The second wiring section 50 electrically connects the second electrode terminal group 212 and the monitoring section 10.

Figure 3:
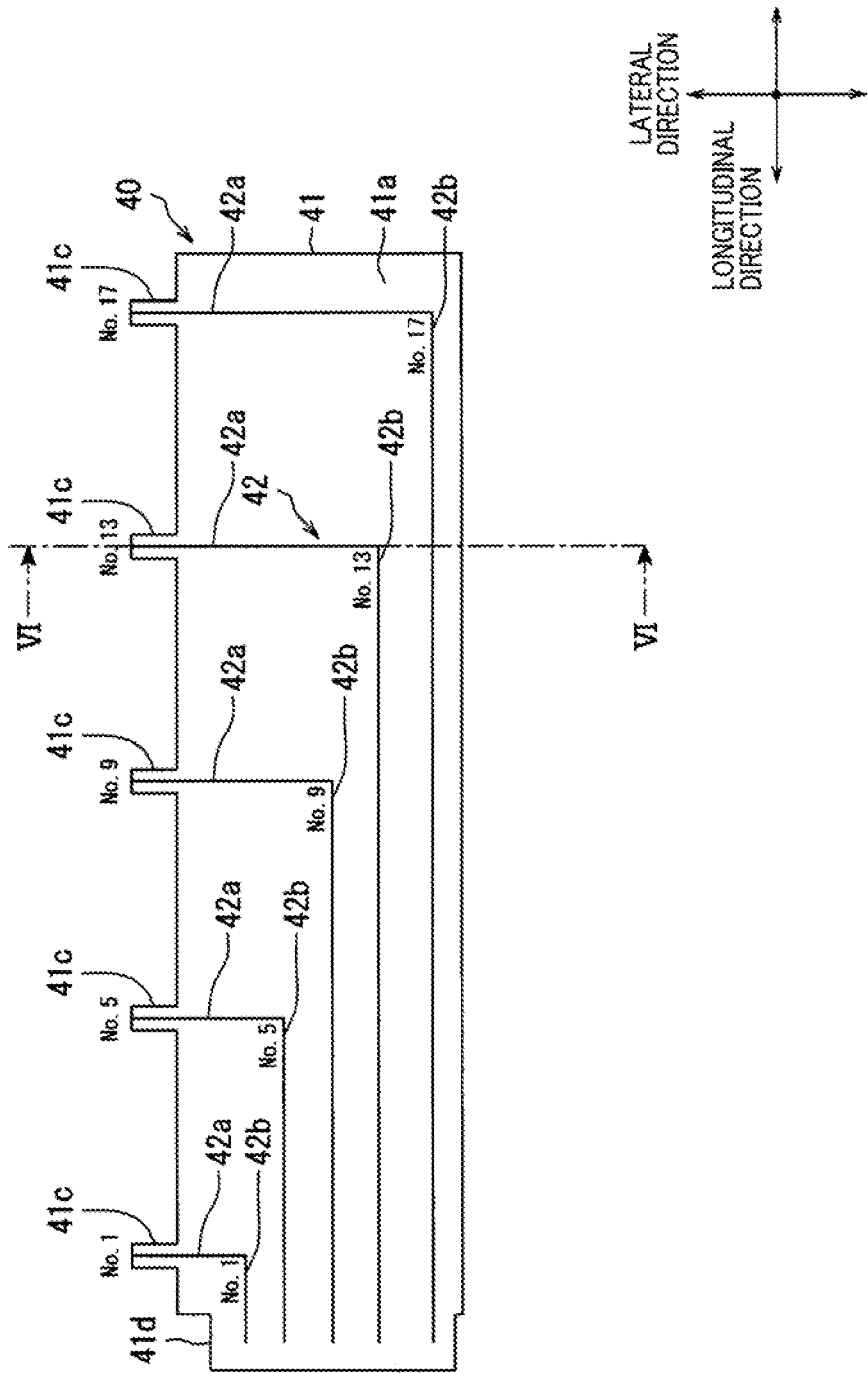
FIG. 3 shows a top view of a first wiring section.
Figure 10:
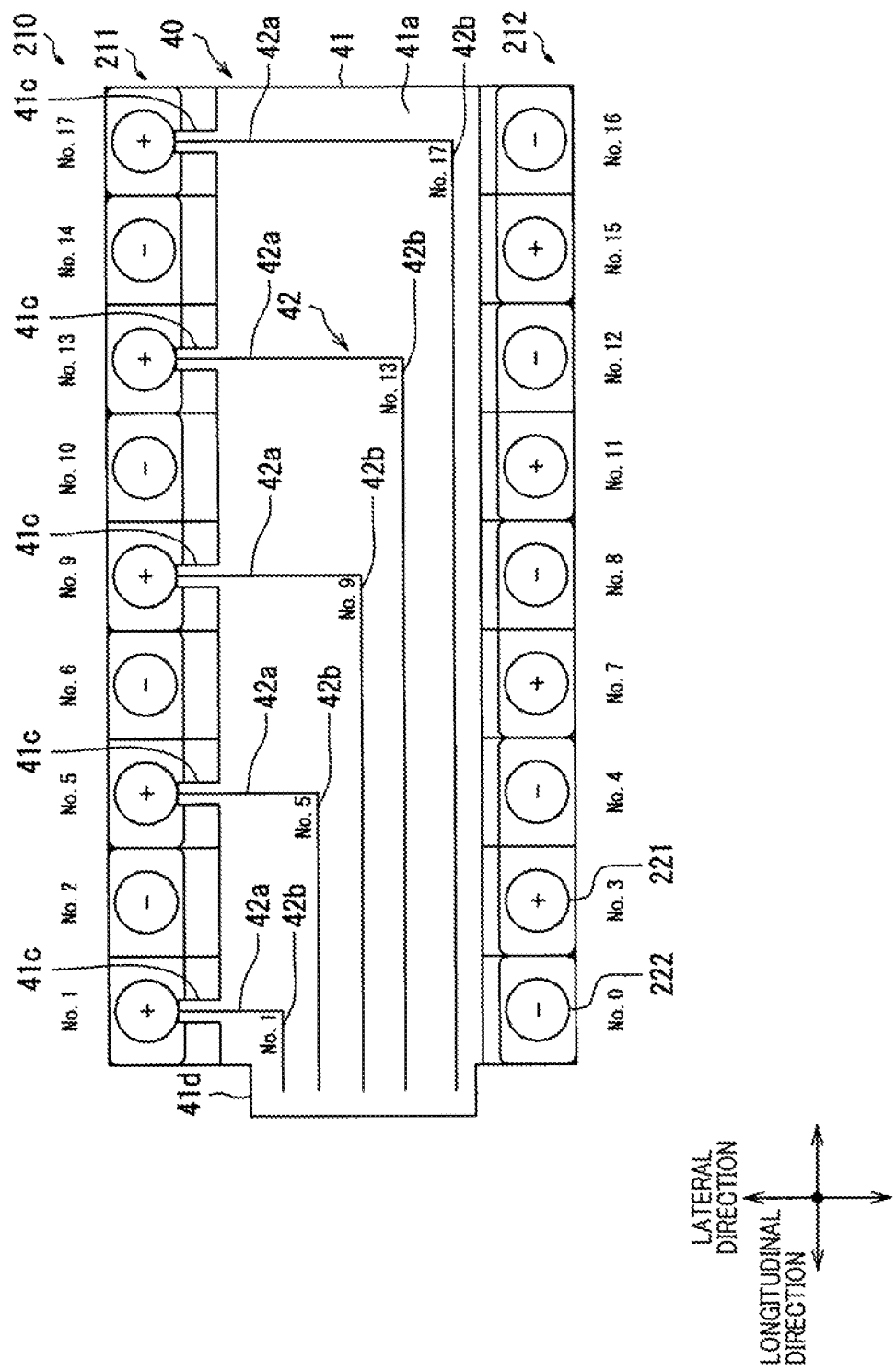
FIG. 10 shows a top view in a state where the first wiring section is disposed on the battery stack.

As shown in FIGS. 3 and 10, the first wiring section 40 electrically connects No. 1, No. 5, No. 9, No. 13, and No 17 positive electrode terminals 221 which are constituents of the first electrode terminal group 211 to the monitoring section 10.

Figure 5:
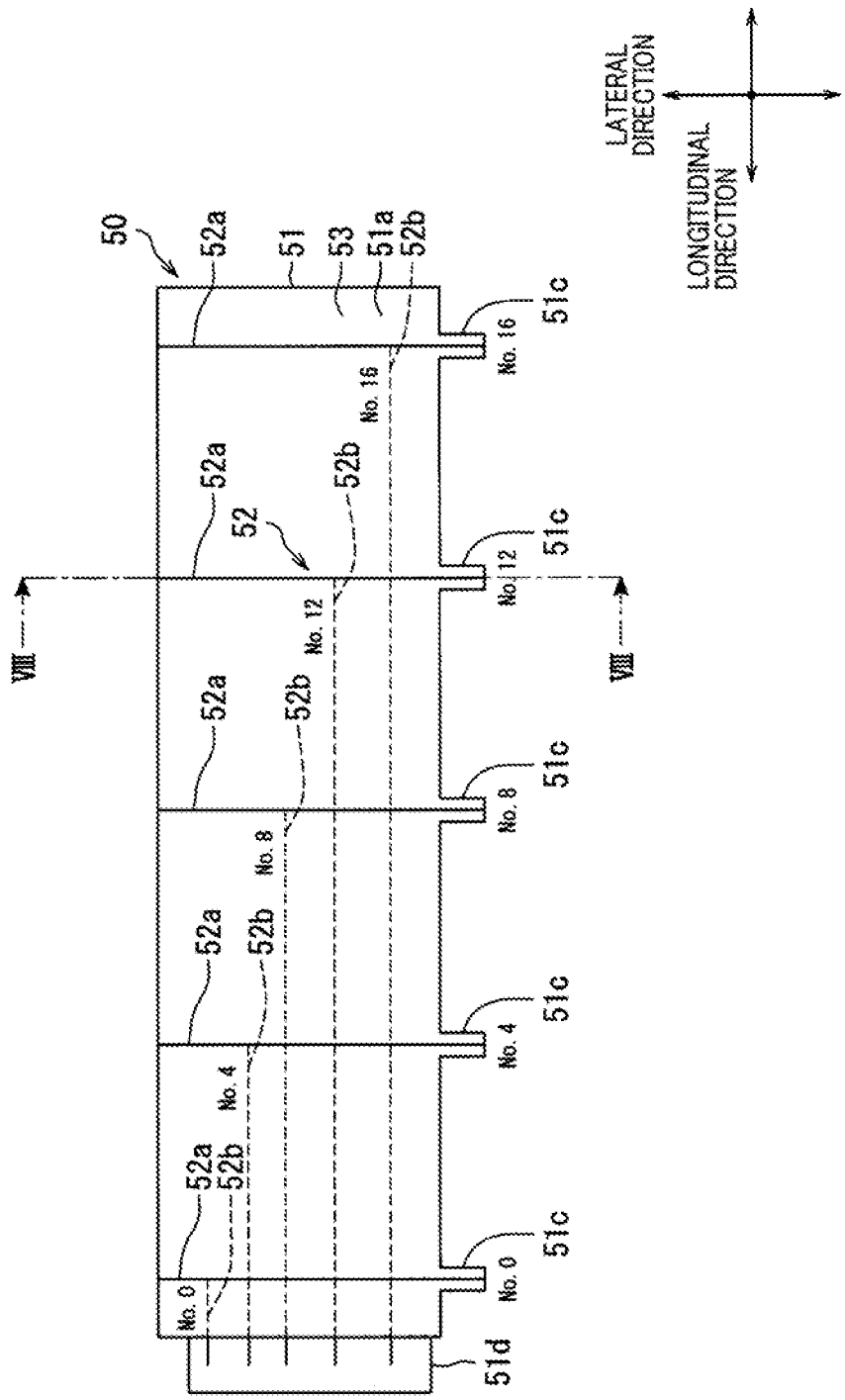
FIG. 5 shows a top view in a state where the second wiring section is bent.
Figure 12:
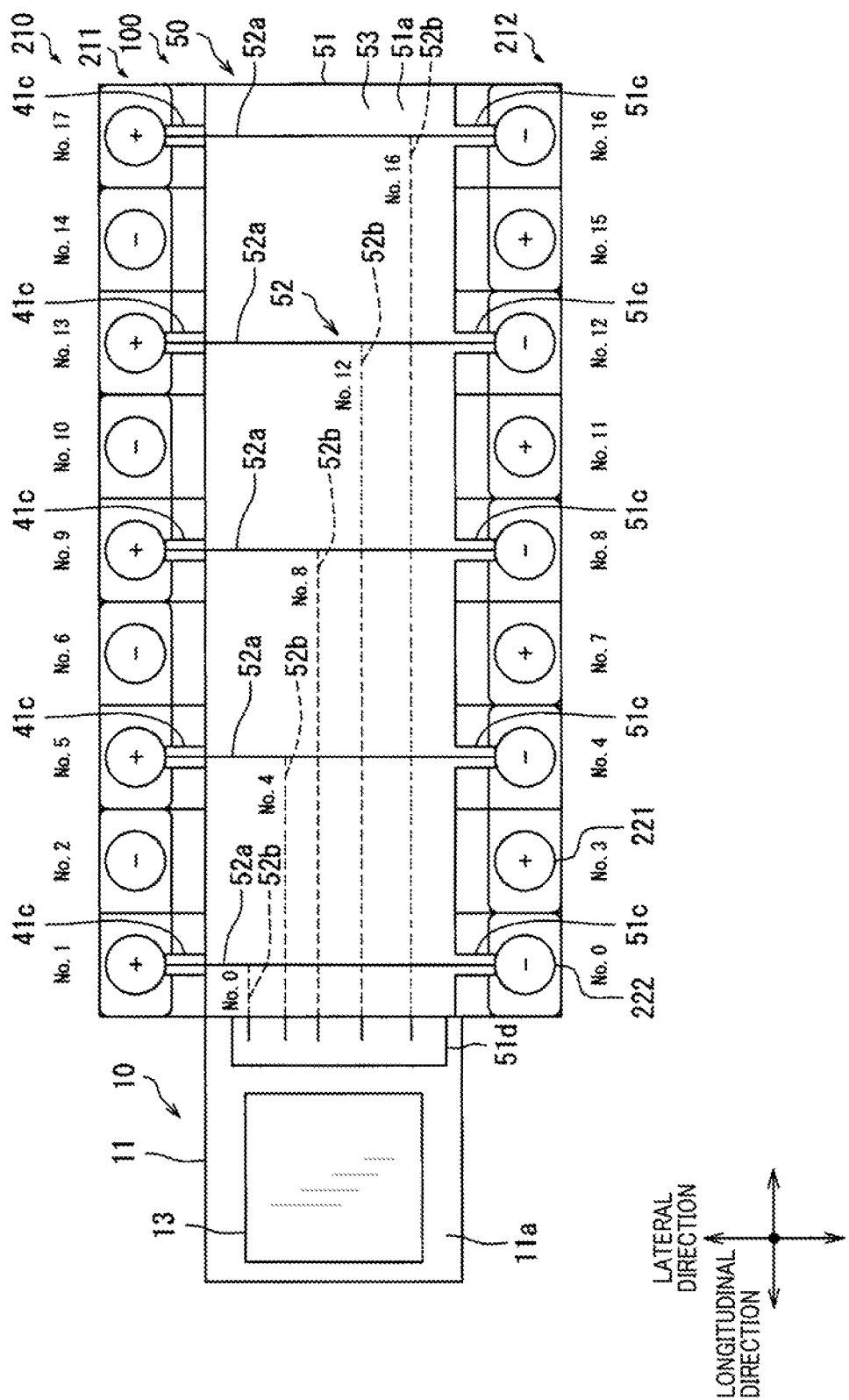
FIG. 12 shows a top view in a state where the monitoring device is disposed on the battery stack.

As shown in FIGS. 5 and 12, the second wiring section 50 electrically connects No. 0, No. 4, No. 8, No. 12, and No. 16 negative electrode terminals 222 which are constituents of the second electrode terminal group 212 to the monitoring section 10.

As a result, the wiring section 30 and the battery stack 210 have the electrical connection configuration shown in FIG. 1.

As a matter of course, the electrical connection between the first wiring section 40 and the second wiring section 50 is not limited to the above example.

For example, the first wiring section 40 electrically connects No. 1, No. 5, No. 9, No. 13, and No 17 positive electrode terminals 221 to the monitoring section 10 in the same manner as described above.

In contrast to this, the second wiring section 50 electrically connects No. 0 negative electrode terminal 222 and No. 3, No. 7, No. 11, and No. 15 positive electrode terminals 221 to the monitoring section 10.

Alternatively, the first wiring section 40 electrically connects No. 2, No. 6, No. 10, and No. 14 negative electrode terminals 222 and No. 17 the positive electrode terminal 221 to the monitoring section 10.

The second wiring section 50 electrically connects No. 0 negative electrode terminal 222 and No. 3, No. 7, No. 11, and No. 15 positive electrode terminal 221 to the monitoring section 10.

As a result, the wiring section 30 and the battery stack 210 also have the electrical connection configuration shown in FIG. 1.

In summary, the first wiring section 40 may be connected to the electrode terminals of at least one of No. 1 and No. 2, at least one of No. 5 and No. 6, at least one of 9 and 10, at least one of No. 13 and No. 14, and No. 17.

The second wiring section 50 may be connected to the electrode terminals of at least one of No. 0, No. 3 and No. 4, at least one of No. 7 and No. 8, at least one of No. 11 and No. 12, and at least one of No. 15 and No. 16.

In addition, the first wiring section 40 and the second wiring section 50 may be connected to the series terminals 223 instead of being connected to the electrode terminals.

Considering a voltage drop due to the resistance of the series terminal 223, the first wiring section 40 and the second wiring section 50 are preferably connected to a midpoint of the series terminal 223.

That is, the first wiring section 40 and the second wiring section 50 may be connected to a relay portion that relays a connection portion of the series terminal 223 to the positive electrode terminal 221 and a connection portion of the negative electrode terminal 222.

As shown in FIG. 3, the first wiring section 40 has a first flexible substrate 41 having flexibility. The first flexible substrate 41 is made of a material which is more flexible than the printed circuit substrate 11 is. The first flexible substrate 41 is thinner than the printed circuit substrate 11.

Therefore, the first flexible substrate 41 is flexible. That is, the first flexible substrate 41 is elastically deformable. The first flexible substrate 41 corresponds to a first substrate.

The first flexible substrate 41 has a rectangular shape extending in the longitudinal direction.

Figure 11:
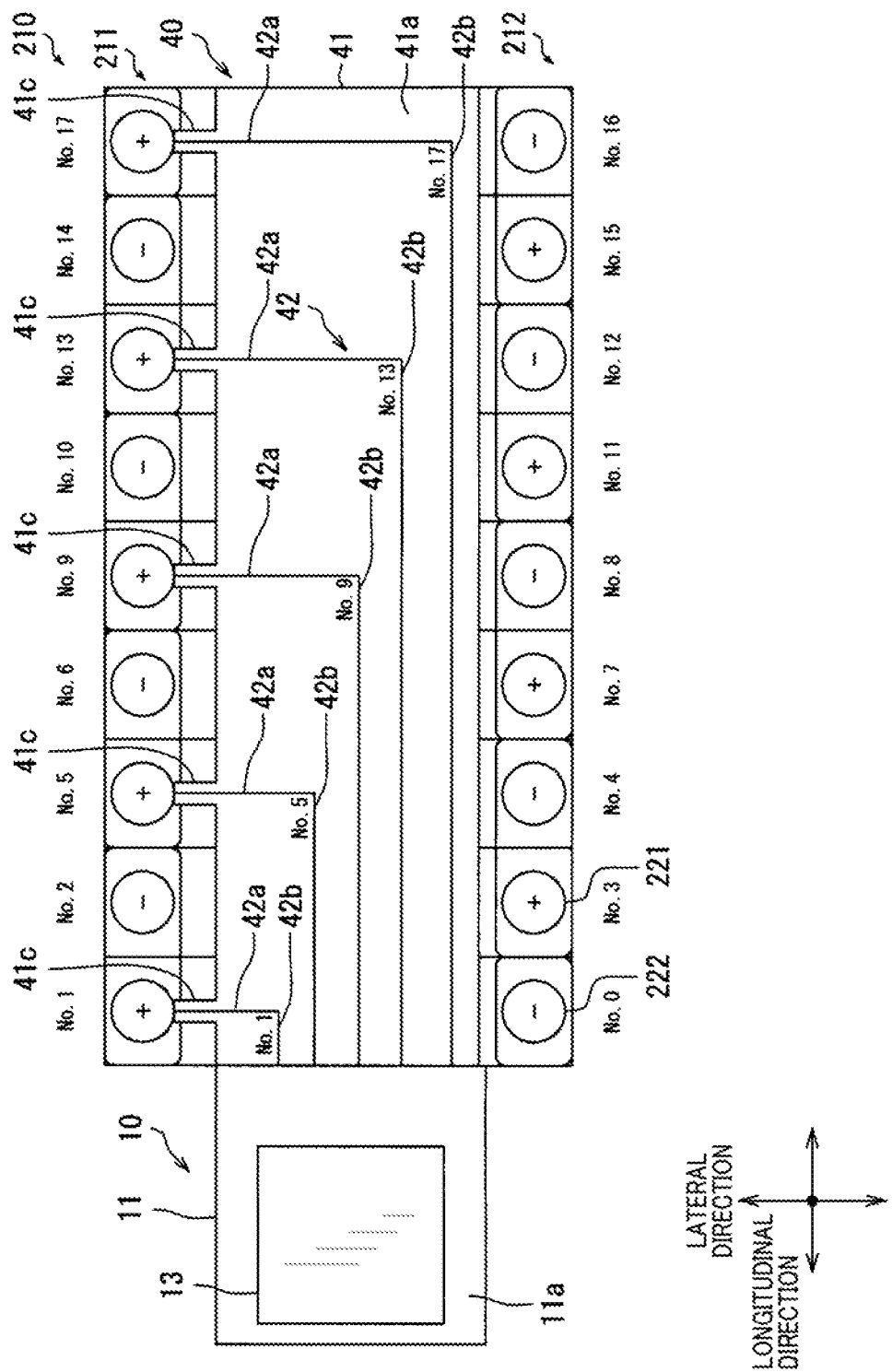
FIG. 11 shows a top view in a state where the first wiring section and the monitoring section are disposed on the battery stack.

As shown in FIGS. 10 and 11, the first flexible substrate 41 is disposed between the first electrode terminal group 211 and the second electrode terminal group 212 of the battery stack 210.

Therefore, a lateral length (lateral width) of the first flexible substrate 41 is shorter than a lateral clearance between the first electrode terminal group 211 and the second electrode terminal group 212.

In the following description, for the sake of convenience, a side of the first electrode terminal group 211 in the lateral direction will be referred to as the upper side and a side of the second electrode terminal group 212 will be referred to as the lower side.

Further, as shown in FIG. 11, the monitoring section 10 is positioned at a side of the battery cell 220 having No. 0 negative electrode terminal 222 in the present embodiment.

Therefore, in the following description, the monitoring section 10 side in the longitudinal direction will be referred to as the left side, and the battery cell 220 having No. 17 positive electrode terminal 221 will be referred to as the right side.

As shown in FIGS. 3 and 10, the first wiring section 40 has a first wiring pattern 42 formed on the first flexible substrate 41.

The first wiring pattern 42 has first lateral wirings 42a extending in the lateral direction and first longitudinal wirings 42b extending in the longitudinal direction.

By ends of the first lateral wirings 42a and the first longitudinal wirings 42b being connected to each other, the first wiring pattern 42 forms a letter L shape.

Ends of the first lateral wirings 42a on the side opposite to ends connected to the first longitudinal wirings 42b are electrically connected to the electrode terminals of the battery cell 220.

Ends of the first longitudinal wirings 42b on the side opposite to ends connected to the first lateral wirings 42a are electrically connected to the monitoring section 10.

Five first wiring patterns 42 are formed on the first flexible substrate 41. These five first wiring patterns 42 correspond to Nos. 1, 5, 9, 13, and 17 electrode terminals, respectively.

These five electrode terminals are arranged in order of increasing numbers from the left side to the right side in the longitudinal direction.

Due to the arrangement of the electrode terminals, the first lateral wirings 42a of the five first wiring patterns 42 are arranged in order from the left side to the right side in the longitudinal direction.

The lengths of the five first lateral wirings 42a in the longitudinal direction increase as the number of the corresponding electrode terminals increases. The five first longitudinal wirings 42b connected to the five first lateral wirings 42a are arranged in order from the upper side to the lower side in the lateral direction.

More specifically, the five first longitudinal wirings 42b corresponding to Nos. 1, 5, 9, 13, and 17 electrode terminals are arranged in order from the upper side to the lower side in the lateral direction.

In this manner, the arrangement from the upper side to the lower side in the lateral direction of the five first longitudinal wirings 42b is directed from a low potential to a high potential.

As shown in FIG. 3, a plurality of first protrusions 41c corresponding to the ends of the first lateral wirings 42a are formed on the first flexible substrate 41.

The plurality of first protrusions 41c extend in the lateral direction from an upper end portion in the lateral direction of the first flexible substrate 41 toward the first electrode terminal group 211.

The plurality of first protrusions 41c are arranged in the longitudinal direction. The ends of the first lateral wirings 42a are disposed in each of the plurality of first protrusions 41c.

Further, a first projecting portion 41d corresponding to the ends of the first longitudinal wirings 42b is formed on the first flexible substrate 41.

The first projecting portion 41d extends in the longitudinal direction from a left end portion in the longitudinal direction of the first flexible substrate 41 toward the monitoring section 10. The ends of the plurality of first longitudinal wirings 42b are disposed in the first projecting portion 41d.

Figure 6:
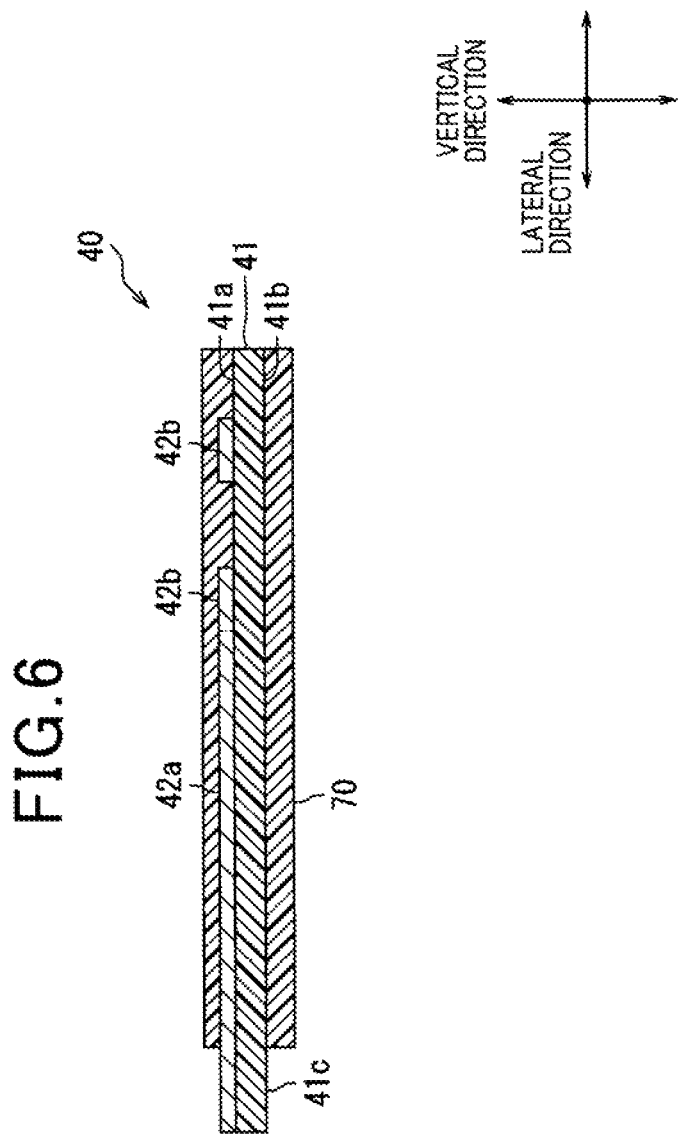
FIG. 6 shows a sectional view taken along a line VI-VI of FIG. 3.

As shown in FIG. 6, the first wiring pattern 42 is formed on a front surface 41a of the first flexible substrate 41. Each of the front surface 41a and a back surface 41b of the first flexible substrate 41 is covered with coating resin 70.

However, the end of the first lateral wiring 42a mounted on the first projecting portion 41c is exposed to an outside from the coating resin 70.

Similarly, although not shown, the end of the first longitudinal wiring 42b mounted on the first projecting portion 41d is also exposed to the outside from the coating resin 70 in a similar manner.

Note that in FIG. 6, a boundary between the first lateral wiring 42a and the first longitudinal wiring 42b is indicated by a broken line.

Figure 4:
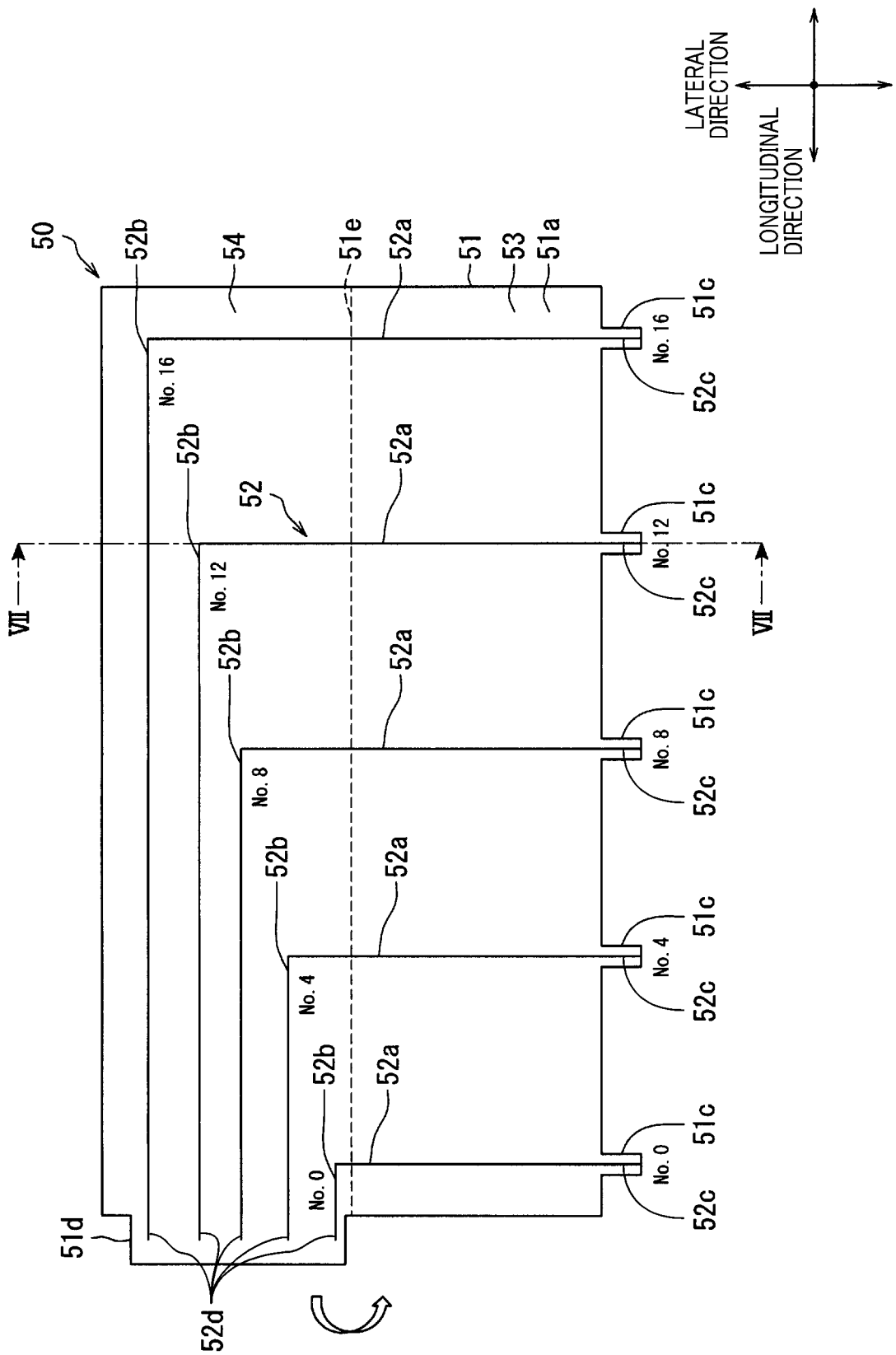
FIG. 4 shows a top view of a second wiring section.

As shown in FIG. 4, the second wiring section 50 has a second flexible substrate 51 having flexibility. The second flexible substrate 51 is made of a material which is more flexible than the printed circuit substrate 11 is.

The second flexible substrate 51 is thinner than the printed circuit substrate 11. Therefore, the second flexible substrate 51 is flexible. That is, the second flexible substrate 51 is elastically deformable. The second flexible substrate 51 corresponds to a second substrate.

The second flexible substrate 51 has a rectangular shape extending in the longitudinal direction.

As will be described in detail later, the second flexible substrate 51 is flexible so as to be folded in the lateral direction. In this bent state, the second flexible substrate 51 is disposed between the first electrode terminal group 211 and the second electrode terminal group 212 of the battery stack 210 as shown in FIG. 12.

Therefore, a lateral length (lateral width) of the second flexible substrate 51 in the bent state is shorter than the lateral clearance between the first electrode terminal group 211 and the second electrode terminal group 212.

However, the lateral width of the second flexible substrate 51 which is not bent is wider than the lateral clearance between the first electrode terminal group 211 and the second electrode terminal group 212.

FIG. 4 shows the second wiring section 50 in a non-bent state. The second wiring section 50 has second wiring patterns 52 formed on the second flexible substrate 51.

Each of the second wiring patterns 52 has a second lateral wiring 52a extending in the lateral direction and a second longitudinal wiring 52b extending in the longitudinal direction.

By end portions of the second lateral wirings 52a and the second longitudinal wirings 52b being connected to each other, each of the second wiring patterns 52 forms the letter L shape.

Ends 52c of the second lateral wiring 52a on the side opposite to ends connected to the second longitudinal wirings 52b are electrically connected to the electrode terminals of the battery cell 220.

Ends 52d of the second longitudinal wirings 52b on the side opposite to ends connected to the second lateral wirings 52a are electrically connected to the monitoring section 10.

Five second wiring patterns 52 are formed on the second flexible substrate 51. These five second wiring patterns 52 correspond to Nos. 0, 4, 8, 12, and 16 electrode terminals, respectively. These five electrode terminals are arranged in order of increasing numbers from the left side to the right side in the longitudinal direction.

Due to the arrangement of the electrode terminals, the second lateral wirings 52a of the five second wiring patterns 52 are arranged in order from the left side to the right side in the longitudinal direction.

The lengths of the five second lateral wirings 52a in the longitudinal direction increase as the number of the corresponding electrode terminal increases.

The five second longitudinal wirings 52b connected to the five second lateral wirings 52a are arranged in order from the upper side to the lower side in the lateral direction.

More specifically, in the non-bent state of the second flexible substrate 51, the five second longitudinal wirings 52b corresponding to Nos. 16, 12, 8, 4, and 0 electrode terminals are arranged in order from the upper side to the lower side in the lateral direction.

In this manner, in the non-bent state of the second flexible substrate 51, the arrangement from the upper side to the lower side in the lateral direction of the five second longitudinal wirings 52b is directed from the high potential to the low potential.

As shown in FIGS. 4 and 5, a plurality of second protrusions 51c corresponding to the ends 2c of the second lateral wiring 52a are formed on the second flexible substrate 51. The plurality of second protrusions 51c are arranged in the longitudinal direction. The ends 52c of the second lateral wirings 52a are disposed in each of the plurality of second protrusions 51c.

Further, a second projecting portion 51d corresponding to the ends of the second longitudinal wirings 52b is formed on the second flexible substrate 51. The ends 52d of the plurality of second longitudinal wirings 52b are disposed in the second projecting portion 51d.

Figure 7:
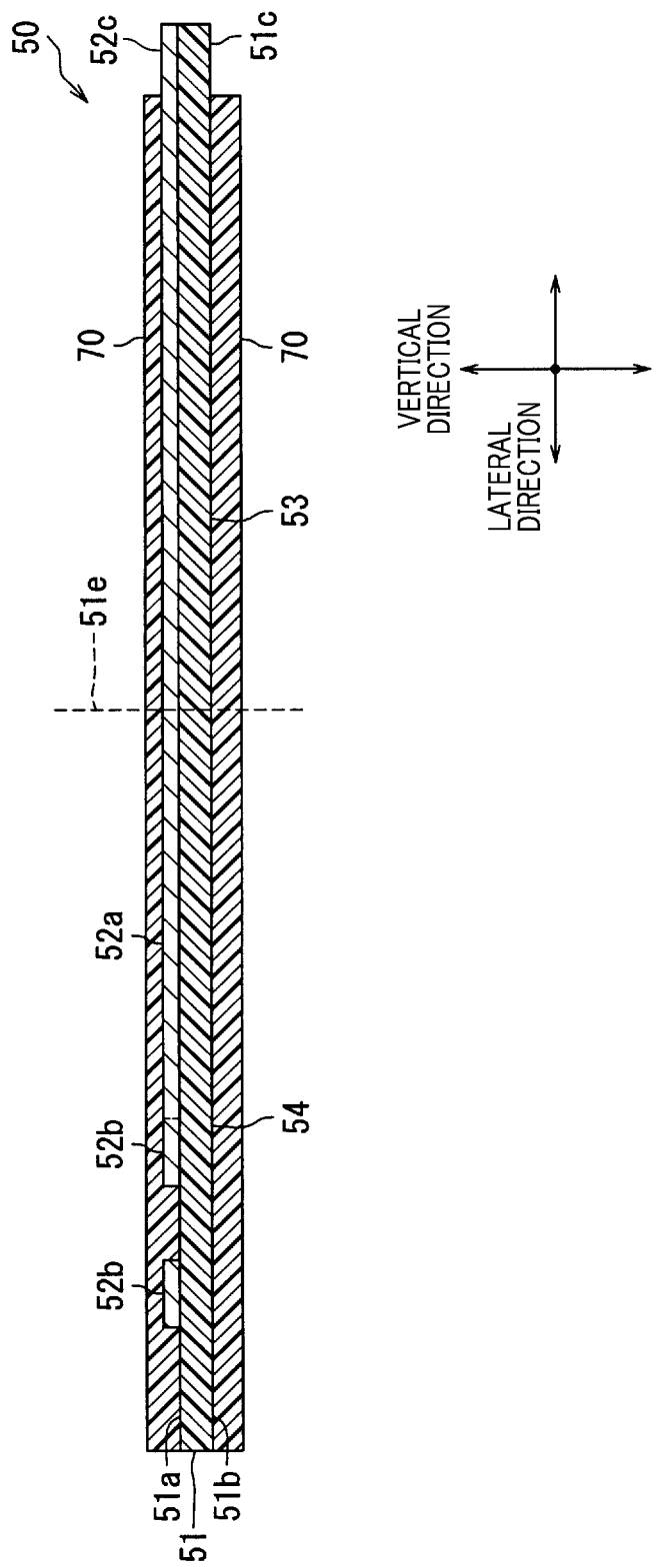
FIG. 7 shows a sectional view taken along a line VII-VII of FIG. 4.

As shown in FIG. 7, the second wiring patterns 52 are formed on a front surface 51a of the second flexible substrate 51. Each of the front surface 51a and a back surface 51b of the second flexible substrate 51 is covered with the coating resin 70.

However, the end 52c of the second lateral wiring 52a mounted on the second protrusion 51c is exposed to the outside from the coating resin 70.

Similarly, although not shown, the end of the second longitudinal wiring 52b mounted on the second projecting portion 51d is also exposed to the outside from the coating resin 70. The front surface 51a corresponds to a formation surface.

Note that in FIG. 7, a boundary between the second lateral wiring 52a and the second longitudinal wiring 52b is indicated by a broken line.

Next, a bend of the second flexible substrate 51 will be described.

The second flexible substrate 51 has a lateral connecting space 53 on which a first end side of the second wiring pattern 52 is disposed and a longitudinal connecting space 54 on which a second end side of the second wiring pattern 52 is disposed.

In other words, the second flexible substrate 51 has the lateral connecting space 53 on which the ends 52c of the second lateral wirings 52a are mounted and the longitudinal connecting space 54 on which the ends 52d of the second longitudinal wirings 52b are mounted.

Further in other words, the second flexible substrate 51 has the lateral connecting space 53 where the second protrusions 51c are formed and the longitudinal connecting space 54 where the second projecting portion 51d is formed.

The lateral connecting space 53 and the longitudinal connecting space 54 each has a rectangular shape extending in the longitudinal direction.

A boundary between the lateral connecting space 53 and the longitudinal connecting space 54 extends in the longitudinal direction.

Therefore, as shown in FIG. 4, in a non-bent state of the second flexible substrate 51, the lateral connecting space 53 and the longitudinal connecting space 54 are arranged in the lateral direction.

In the lateral connecting space 53, only the second lateral wirings 52a in the second wiring patterns 52 are formed.

The plurality of second protrusions 51c extending in the lateral direction toward the second electrode terminal group 212 are formed at a lower end portion in the lateral direction of the lateral connecting space 53.

The connection ends of the second lateral wirings 52a connected with the second longitudinal wirings 52b and the second longitudinal wirings 52b are formed on the longitudinal connecting space 54.

The second projecting portion 51d extending in the longitudinal direction toward the monitoring section 10 is formed at the left end portion of the longitudinal connecting space 54 in the longitudinal direction.

Figure 8:
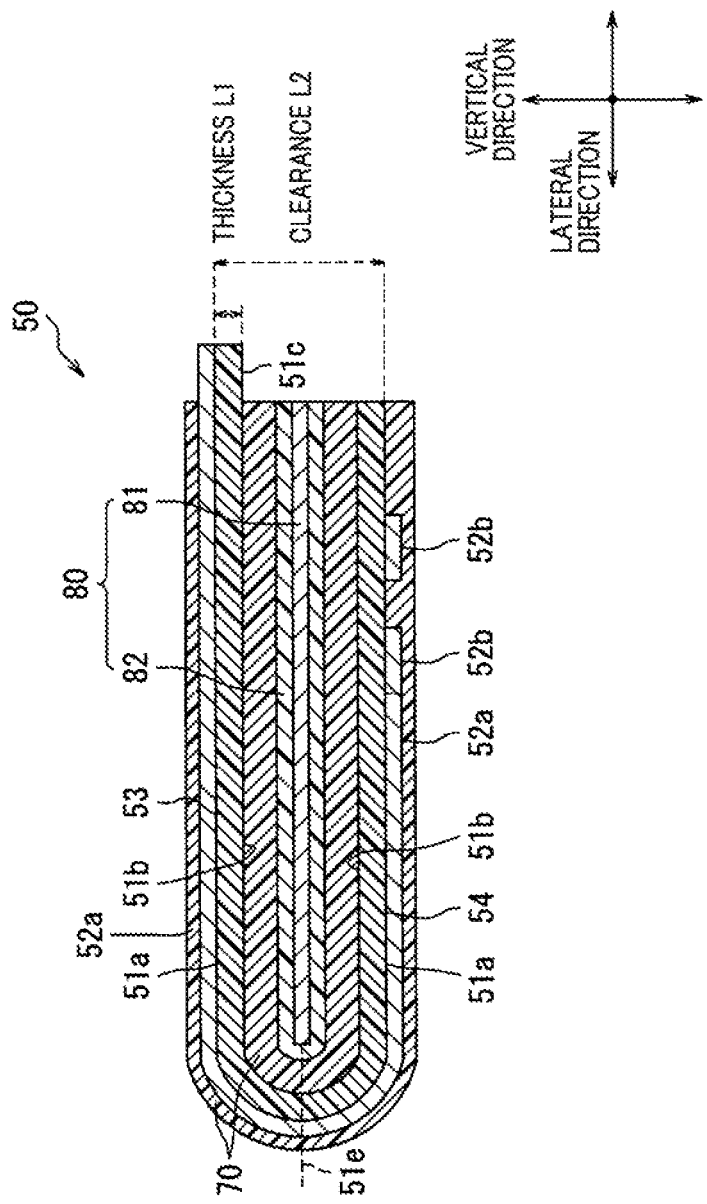
FIG. 8 shows a sectional view taken along a line VIII-VIII of FIG. 5.

As shown by broken lines in FIGS. 4, 7, and 8, a first bend line 51e (perforation) for facilitating the bending of the second flexible substrate 51 is formed at the boundary between the lateral connecting space 53 and the longitudinal connecting space 54. The first bend line 51e is formed along the longitudinal direction.

The first bend line 51e is composed of a plurality of intermittent notches penetrating the front surface 51a and the back surface 51b of the second flexible substrate 51. For this reason, the lateral connecting space 53 and the longitudinal connecting space 54 are mechanically connected via portions between the plurality of notches of the first bend line 51e.

It should be noted that the first bend line 51e may be formed by alternately arranging portions where the thickness is locally thin and thick.

As shown in FIG. 4, the second lateral wirings 52a extend from the lateral connecting space 53 to the longitudinal connecting space 54 via the first bend line 51e. In this way, the second lateral wirings 52a traverse the first bend line 51e.

The longitudinal length (width) of a portion in the second lateral wiring 52a formed at the first bend line 51e is wider than the length of the intermittent notch forming the first bend line 51e in the longitudinal direction.

Therefore, the second lateral wiring 52a is formed at a portion between the plurality of notches of the first bend line 51e. The longitudinal direction corresponds to a formation direction.

It should be noted that the first bend line 51e may optionally not be formed on the second flexible substrate 51.

As shown in FIGS. 5 and 8, the lateral connecting space 53 and the longitudinal connecting space 54 are bent with the first bend line 51e as a center. By this bending, the back surface 51b of the lateral connecting space 53 and the back surface 51b of the longitudinal connecting space 54 are opposed to each other in the vertical direction.

Thereby, a clearance L2 in the vertical direction between the second wiring pattern 52 formed on the front surface 51a of the lateral connecting space 53 and the second wiring pattern 52 formed on the front surface 51a of the longitudinal connecting space 54 is wider than the thickness L1 of the second flexible substrate 51.

The clearance L2 is set so that capacitive coupling between the second wiring pattern 52 formed in the lateral connecting space 53 and the second wiring pattern 52 formed in the longitudinal connecting space 54 is avoided.

As shown in FIG. 8, the lateral connecting space 53 and the longitudinal connecting space 54 are mechanically connected via a connecting part 80. As a result, the bent state of the second wiring section 50 is maintained.

The connecting part 80 has a shielding layer 81 and a resin layer 82. The shield layer 81 is a thin metal film or a thin metal plate.

The shield layer 81 is connected to the ground potential of the monitoring section 10 or No. 0 negative electrode terminal 222. The shield layer 81 is disposed between the lateral connecting space 53 and the longitudinal connecting space 54.

The shield layer 81 is covered with the resin layer 82. The resin layer 82 is disposed between the shield layer 81 and the lateral connecting space 53 and between the shield layer 81 and the longitudinal connecting space 54.

The shield layer 81 and the lateral connecting space 53, and the shield layer 81 and the longitudinal connecting space 54 are mechanically connected to each other by the resin layer 82.

As a matter of course, a clearance between the shield layer 81 and the second wiring pattern 52 is set so as to avoid capacitive coupling between the shield layer 81 and the second wiring pattern 52.

Further, the connecting part 80 may not have the shielding layer 81 in the first place. In addition, the connecting part 80 may not be needed.

For example, the bent state of the second wiring section 50 may be maintained by welding and joining the lateral connecting space 53 and the longitudinal connecting space 54.

FIG. 5 shows the second flexible substrate 51 in the bent state.

As clearly shown in FIG. 5, the lateral arrangement order of the five second longitudinal wirings 52b formed in the longitudinal connecting space 54 is reversed by bending (folding) the second wiring section 50 in the lateral direction.

That is, as shown in FIG. 4, before the bending of the second flexible substrate 51, the five second longitudinal wirings 52b corresponding to Nos. 16, 12, 8, 4, and 0 electrode terminals were arranged in order from the upper side to the lower side in the lateral direction.

On the other hand, as shown in FIG. 5, after the bending of the second flexible substrate 51, the five second longitudinal wirings 52b corresponding to Nos. 0, 4, 8, 12, and 16 electrode terminals are arranged in order from the upper side to the lower side in the lateral direction.

In the second flexible substrate 51 in the bent state as described above, the arrangement of the five second longitudinal wirings 52b from the upper side to the lower side in the lateral direction is directed from the low potential to the high potential.

The second wiring section 50 in the bent state is connected to the monitoring section 10.

Figure 9:
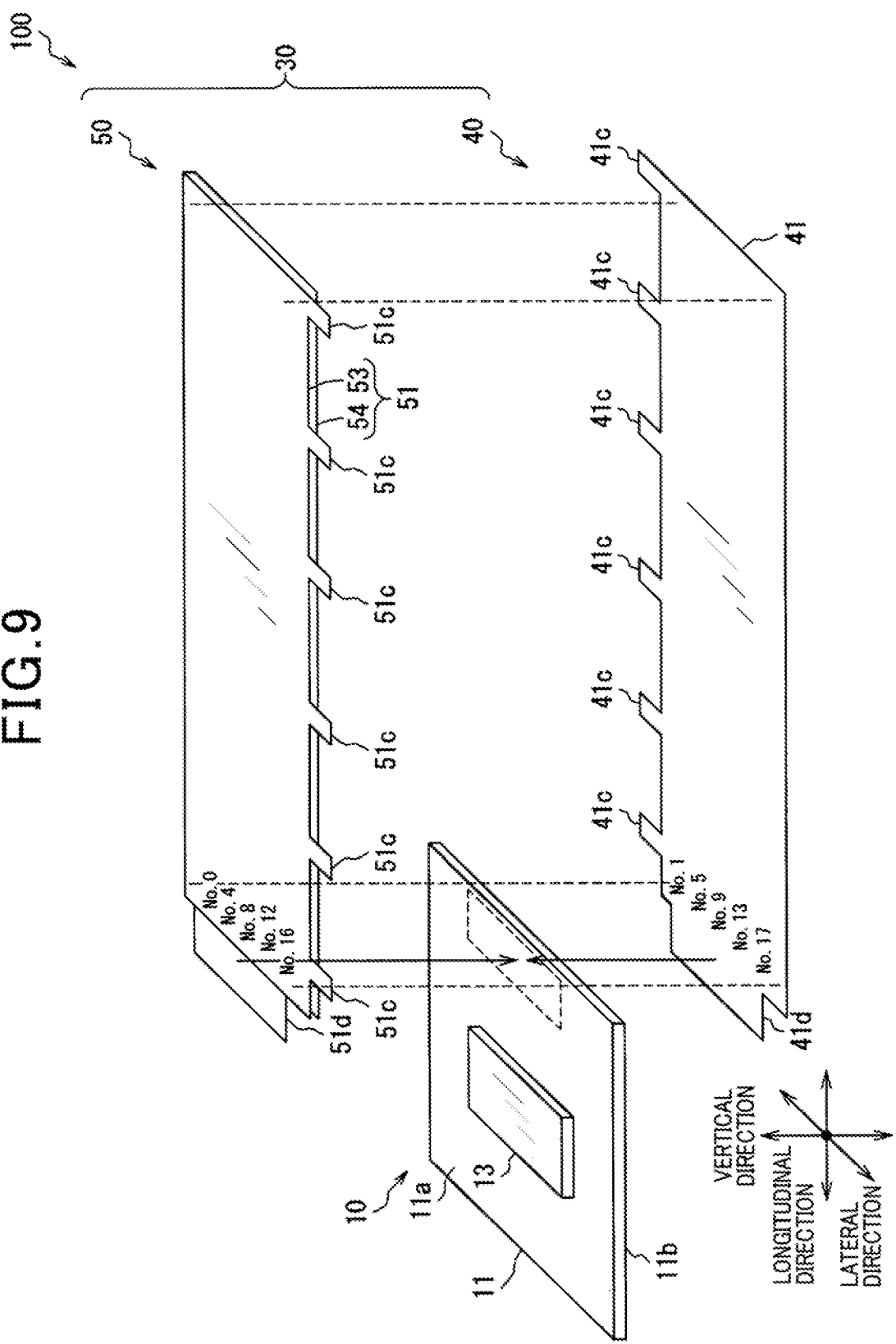
FIG. 9 shows an exploded perspective view of a monitoring device.

As shown in FIG. 9, the first wiring section 40 is connected to a back surface 11b of the printed circuit substrate 11 of the monitoring section 10.

The second wiring section 50 in the bent state is connected to a front surface 11a of the printed circuit substrate 11.

That is, the first projecting portion 41d is connected to the back surface 11b of the printed circuit substrate 11. Then, the second projecting portion 51d is connected to the front surface 11a of the printed circuit substrate 11.

The first projecting portion 41d and the second projecting portion 51d are opposed to each other with the printed circuit substrate 11 interposed therebetween.

It should be noted that the illustration of the first wiring pattern 42 and the second wiring pattern 52 is omitted, and only the numbers of the corresponding electrode terminal is shown in FIG. 9.

Then, connecting areas of the first projecting portion 41d and the second projecting portion 51d on the printed circuit substrate 11 are shown surrounded by a broken line.

According the above connection, the five first longitudinal wirings 42b corresponding to Nos. 1, 5, 9, 13, and 17 electrode terminals are arranged in order from the upper side to the lower side in the lateral direction on the back surface 11b of the printed circuit substrate 11.

In addition, the five second longitudinal wirings 52b corresponding to Nos. 0, 4, 8, 12, and 16 electrode terminals are arranged in order from the upper side to the lower side in the lateral direction on the front surface 11a.

As described above, the wirings corresponding to the low potential to the high potential are arranged in order from the upper side to the lower side in the lateral direction.

In the present embodiment, the five second longitudinal wirings 52b corresponding to Nos. 0, 4, 8, 12, and 16 electrode terminals in the lateral direction are disposed between the five first longitudinal wirings 42b corresponding to Nos. 1, 5, 9, 13, and 17 electrode terminals in order of potential.

As a result, the wirings corresponding to Nos. 0, 1, 4, 5, 8, 9, 12, 13, 16, and 17 electrode terminals are arranged in order from the upper side to the lower side in the lateral direction. In accordance with this, ten substrate wirings 14 are disposed side by side in the lateral direction on the printed circuit substrate 11.

The first wiring section 40 and the second wiring section 50 are mechanically connected to each other at four corners connected by broken lines in FIG. 9 by welding or the like.

However, in order to avoid capacitive coupling between the first wiring section 40 and the second wiring section 50, a space for interposing an insulator such as air is disposed between the first wiring section 40 and the second wiring section 50.

States in which the first wiring section 40, the monitoring section 10, and the second wiring section 50 are sequentially disposed in the battery stack 210 are shown in FIG. 10, FIG. 11, and FIG. 12.

As shown in FIG. 10, the first wiring section 40 is mounted on the battery stack 210 in such a manner that the back surface 41b of the first flexible substrate 41 faces the upper surface 220a of the battery cell 220. Then, as shown in FIG. 11, the front surface 41a of the first projecting portion 41d is connected to the back surface 11b of the printed circuit substrate 11.

As described above, the ends of the first longitudinal wirings 42b mounted on the first projecting portion 41d are exposed to the outside from the coating resin 70.

The ends of the first longitudinal wirings 42b exposed to the outside from the coating resin 70 are electrically connected to the substrate wirings 14 on the back surface 11b of the printed circuit substrate 11.

As shown in FIG. 12, the second wiring section 50 is mounted on the battery stack 210 in such a manner that the back surface 51b of the longitudinal connecting space 54 of the second flexible substrate 51 faces the front surface 41a of the first flexible substrate 41. The front surface 51a of the second projecting portion 51d is connected to the front surface 11a of the printed circuit substrate 11.

As described above, the ends 52d of the second longitudinal wirings 52b mounted on the second projecting portion 51d are exposed to the outside from the coating resin 70. The ends 52d of the second longitudinal wirings 52b exposed to the outside from the coating resin 70 are electrically connected to the substrate wirings 14 on the front surface 11a of the printed circuit substrate 11.

As shown in FIG. 1, the wiring section 30 includes second electronic elements 60 in addition to the first wiring section 40 and the second wiring section 50. The second electronic elements 60 are disposed in each of the first wiring pattern 42 and the second wiring pattern 52.

Each of the second electronic elements 60 has a fuse 61 and an inductor 62. Further, as shown in FIG. 1, the monitoring section 10 includes a Zener diode 15, a parallel capacitor 16, and a resistor 17 as the first electronic element 12.

In the following description, for the sake of simplicity of explanation, it is assumed that wirings constituted by the first wiring pattern 42 and the second wiring pattern 52 connecting between the adjacent battery cells 220 connected in series, and the substrate wiring 14 are referred to as voltage detection wirings.

The same number of voltage detection wirings as the electrode terminals are formed.

The fuse 61, the inductor 62, and the resistor 17 are disposed for each of the voltage detection wirings. The fuse 61, the inductor 62, and the resistor 17 are connected in series in this order from the battery cell 220 to the monitoring IC chip 13.

Each of the Zener diode 15 and the parallel capacitor 16 is connected in parallel between two adjacent voltage detection wirings. Specifically, the Zener diode 15 and the parallel capacitor 16 are connected between the inductor 62 and the resistor 17 in the voltage detection wiring.

An anode electrode of the Zener diode 15 is connected to the low potential side. A cathode electrode of the Zener diode 15 is connected to the high potential side.

The Zener diodes 15 and the parallel capacitors 16 are mounted on the printed circuit substrate 11.

The Zener diode 15 has a structure that causes a short circuit failure when an overvoltage is applied from the battery module 200. Specifically, the Zener diode 15 has a structure in which a PN junction type IC chip is sandwiched directly by a pair of leads.

Accordingly, unlike a configuration in which the IC chip and the leads are connected via wires, the wires are broken by an application of an overvoltage, thereby avoiding the open failure of the Zener diode 15.

The fuse 61 is configured to be broken by a large current flowing through the voltage detection wiring when the Zener diode 15 is short-circuited due to an overvoltage. A rated current of the fuse 61 is set based on a large current flowing through the voltage detection wiring when the Zener diode 15 is short-circuited due to the overvoltage.

Further, the resistor 17 and the parallel capacitor 16 constitute an RC circuit. The RC circuit and the inductor 62 function as a filter for removing noise during voltage detection.

Further, the resistor 17 constituting the RC circuit functions as a current limiting resistor during an equalization processing to be described later.

Although not shown, the monitoring IC chip 13 has a microcomputer and switches corresponding to each of the plurality of battery cells 220. These switches control the connections between the two voltage detection wirings.

Therefore, charging and discharging of the battery cell 220 electrically connected to the corresponding voltage detection wiring are controlled by opening/closing control of these switches.

Performances and characteristics of each battery cell 220 are different from each other due to product variation. Therefore, an SOC of each battery cell 220 varies when charging and discharging are repeated. The SOC stands for a state of charge. This SOC has a correlation with an induced voltage of the battery cell 220.

Due to the nature of the battery cell 220, overdischarge and overcharge must be suppressed from being generated. In other words, the overdischarge and overcharge are extreme decrease and extreme increase of the SOC.

The fact that the SOC of each battery cell 220 varies means that the degree of overdischarge and overcharge of each battery cell 220 also varies.

Therefore, it is necessary to equalize the SOCs of the plurality of battery cells 220 constituting the battery stack 210 in order to accurately control the SOC so that the SOC of the battery stack 210 does not become overdischarged and overcharged.

In other words, it is necessary to match the SOC of each of the plurality of battery cells 220 with the SOC of the battery stack 210, which is the total sum of the battery cells 220.

Because of this requirement, the microcomputer of the monitoring IC chip 13 detects and monitors the output voltage (induced voltage) of each of the plurality of battery cells 220. This output voltage is inputted to the battery ECU 300.

The battery ECU 300 stores correlation between the SOC and the induced voltage. The battery ECU 300 detects the SOC of each of the plurality of battery cells 220 based on the inputted output voltage (induced voltage) and the stored correlation.

The battery ECU 300 determines equalization processing of the SOCs of the plurality of battery cells 220 based on the detected SOCs. Then, the battery ECU 300 outputs an instruction for equalization processing to the microcomputer of the monitoring IC chip 13 based on the determination.

The microcomputer controls opening and closing of switches corresponding to each of the plurality of battery cells 220 based on the instruction for equalization processing. Thereby, the equalization processing is executed.

It should be noted that the battery ECU 300 also detects the SOC of the battery stack 210 based on the inputted voltage and the like. The battery ECU 300 outputs the detected SOC of the battery stack 210 to the in-vehicle ECU.

The in-vehicle ECU outputs a command signal to the battery ECU 300 based on this SOC, vehicle information such as a depression amount of an accelerator pedal inputted from various sensors mounted on the vehicle and a throttle valve opening degree, and an ignition switch or the like.

The battery ECU 300 controls the connection between the battery pack 400 and the electric load based on this command signal.

Although not shown, a system main relay is disposed between the battery stack 210 and the battery pack 400. The system main relay controls the electrical connection between the battery stack 210 and the battery pack 400 by generation of a magnetic field.

The battery ECU 300 controls the connection between the battery pack 400 and the electrical load by controlling the generation of the magnetic field of the system main relay.

Functions and Effects

Next, functions and effects of the monitoring device 100 of the battery pack 400 will be described.

As described above, the second flexible substrate 51 is bent so that the lateral connecting space 53 and the longitudinal connecting space 54 are opposed to each other in the vertical direction.

The boundary between the lateral connecting space 53 and the longitudinal connecting space 54 extends in the longitudinal direction, and the second flexible substrate 51 is bent around the boundary.

As a result, it is possible to change the arrangement of the second longitudinal wirings 52b of the second wiring pattern 52 in the lateral direction.

That is, the five second longitudinal wirings 52b corresponding to Nos. 16, 12, 8, 4, and 0 electrode terminals aligned in order from the upper side to the lower side in the lateral direction can be reversed to be arranged in order from the lower side to the upper side.

In other words, the five second longitudinal wirings 52b corresponding to No. 0, 4, 8, 12, 16 electrode terminals can be arranged in order from the upper side to the lower side in the lateral direction.

As a result, the arrangement from the upper side to the lower side in the lateral direction of the five second longitudinal wirings 52b can be arranged from the low potential to the high potential similarly to the first longitudinal wiring 42b of the first wiring pattern 42.

Figure 13:
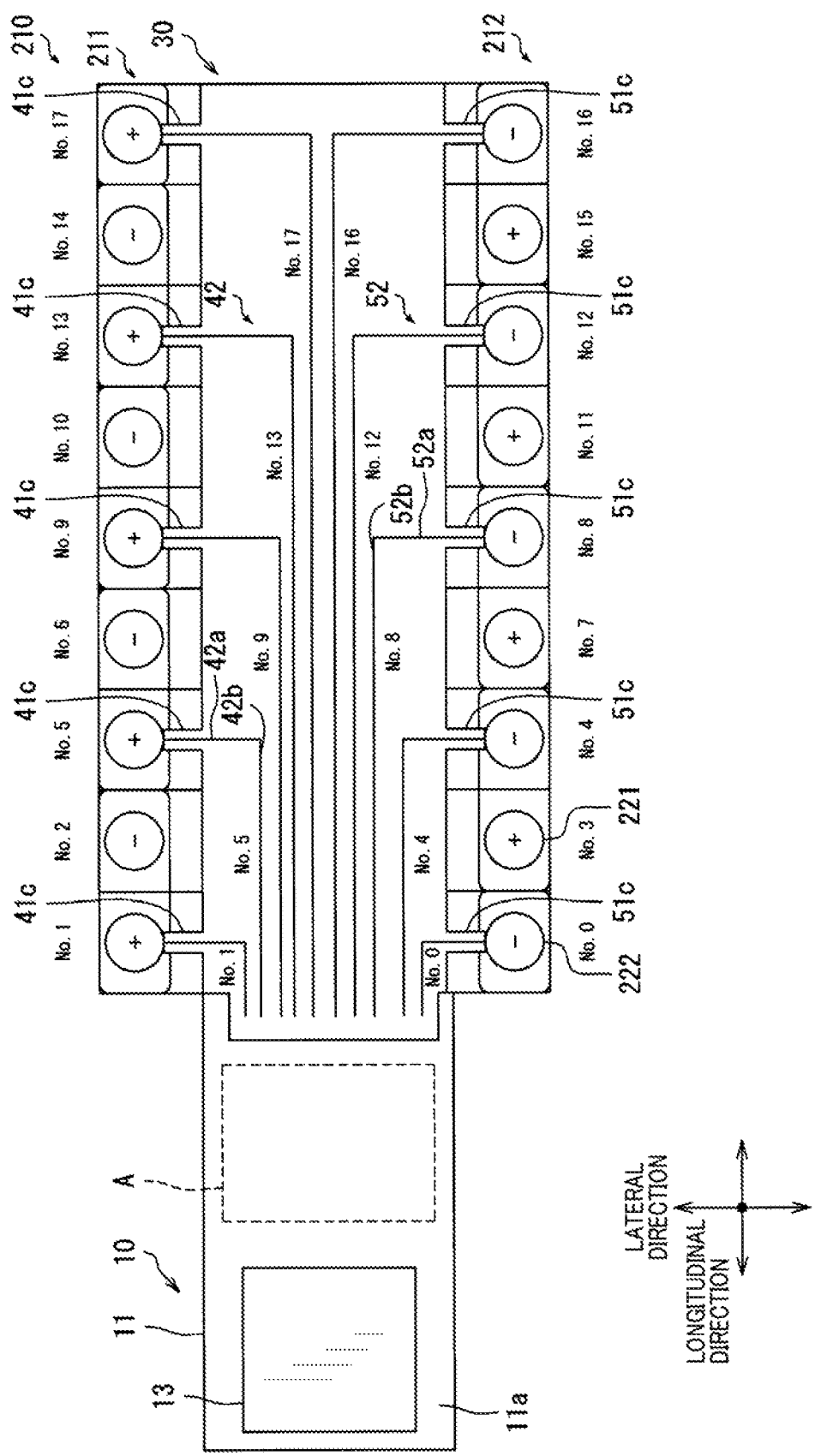
FIG. 13 shows a top view of a battery pack as a comparative configuration.

As described above, for example, unlike a configuration in which the order of the potentials of the first wiring pattern 42 and the second wiring pattern 52 are opposite to each other and are mutually separated in the lateral direction as shown in FIG. 13, it is not necessary to change the wiring layout of the wiring 14 in the printed circuit substrate 11.

Therefore, it is possible to omit an area A for changing the wiring layout surrounded by the broken line in FIG. 13.

As a result, the size of the printed circuit substrate 11 is suppressed from increasing.

Further, the size of the monitoring section 10 is suppressed from increasing.

As described above, it is possible to arrange the plurality of substrate wirings 14 in order from the low potential to the high potential in the lateral direction.

Therefore, by disposing the Zener diode 15 and the parallel capacitor 16 between the two substrate wirings 14 that are adjacent to each other in potential, it is possible to connect them in parallel between two adjacent substrate wirings 14.

Further, the potential difference between the adjacent substrate wirings 14 is about the output voltage of a single battery cell 220.

Thereby, an insulation distance of the adjacent substrate wirings 14 is suppressed from increasing. As a result, the size of the printed circuit substrate 11 is suppressed from increasing.

It should be noted that the thickness of the second flexible substrate 51 is made thin in order to ensure flexibility.

Therefore, if the second wiring pattern 52 is formed on each of the front surface 51a and the back surface 51b of the second flexible substrate 51, for example, there is a possibility that the second wiring pattern 52 on the front surface 51a and the second wiring pattern 52 on the back surface 51b are capacitively coupled.

However, as described above, the order of arrangement of the second wiring patterns 52 is reversed by bending the second flexible substrate 51 in the present embodiment.

As a result, it is possible to match the arrangement order of the first wiring pattern 42 and the second wiring pattern 52 while capacitive coupling between the second wiring patterns 52 is suppressed from occurring.

The first projecting portion 41d of the first wiring section 40 is connected to the back surface 11b of the printed circuit substrate 11. The second projecting portion 51d of the second wiring section 50 in the bent state is connected to the front surface 11a of the printed circuit substrate 11.

The first projecting portion 41d and the second projecting portion 51d are arranged to face each other with the printed circuit substrate 11 interposed therebetween.

Therefore, for example, in comparison with the configuration in which the first wiring section 40 and the second wiring section 50 are connected to the front surface 11a of the printed circuit substrate 11 while being spaced apart in the lateral direction, as shown in FIG. 13, the size of the space on the printed circuit substrate 11 connected to the wiring section 30 is suppressed from increasing.

The back surface 51b of the lateral connecting space 53 and the back surface 51b of the longitudinal connecting space 54 are opposed to each other in the vertical direction by the bending of the second flexible substrate 51.

This suppresses capacitive coupling from occurring between the second wiring pattern 52 formed on the front surface 51a of the lateral connecting space 53 and the second wiring pattern 52 formed on the front surface 51a of the longitudinal connecting space 54.

The first bend line 51e for facilitating the bending of the lateral connecting space 53 and the longitudinal connecting space 54 is formed at the boundary between the lateral connecting space 53 and the longitudinal connecting space 54. This facilitates the bending of the second flexible substrate 51.

The longitudinal length of a portion in the second lateral wiring 52a formed at the first bend line 51e is wider than the length of the intermittent notch forming the first bend line 51e in the longitudinal direction.

According to this, the second lateral wirings 52a are necessarily formed at the portions between the plurality of notches of the first bend line 51e.

Therefore, electrical connection defects in the second lateral wiring 52a due to the first bend line 51e are suppressed from occurring.

Second Embodiment

Next, a second embodiment will be described with reference to FIGS. 14 to 16.

A monitoring device of each embodiment described below has many features in common with the above-described embodiment. For that reason, the explanation of the common parts will be omitted below, and the different parts will be focused on.

In the following description, the same reference numerals are given to the same elements as those shown in the above-described embodiment.

In the first embodiment, an example is shown in which the first flexible substrate 41 and the second flexible substrate 51 are separate bodies.

In contrast, in the present embodiment, a first flexible substrate 41 and a second flexible substrate 51 are integrally connected.

Figure 14:
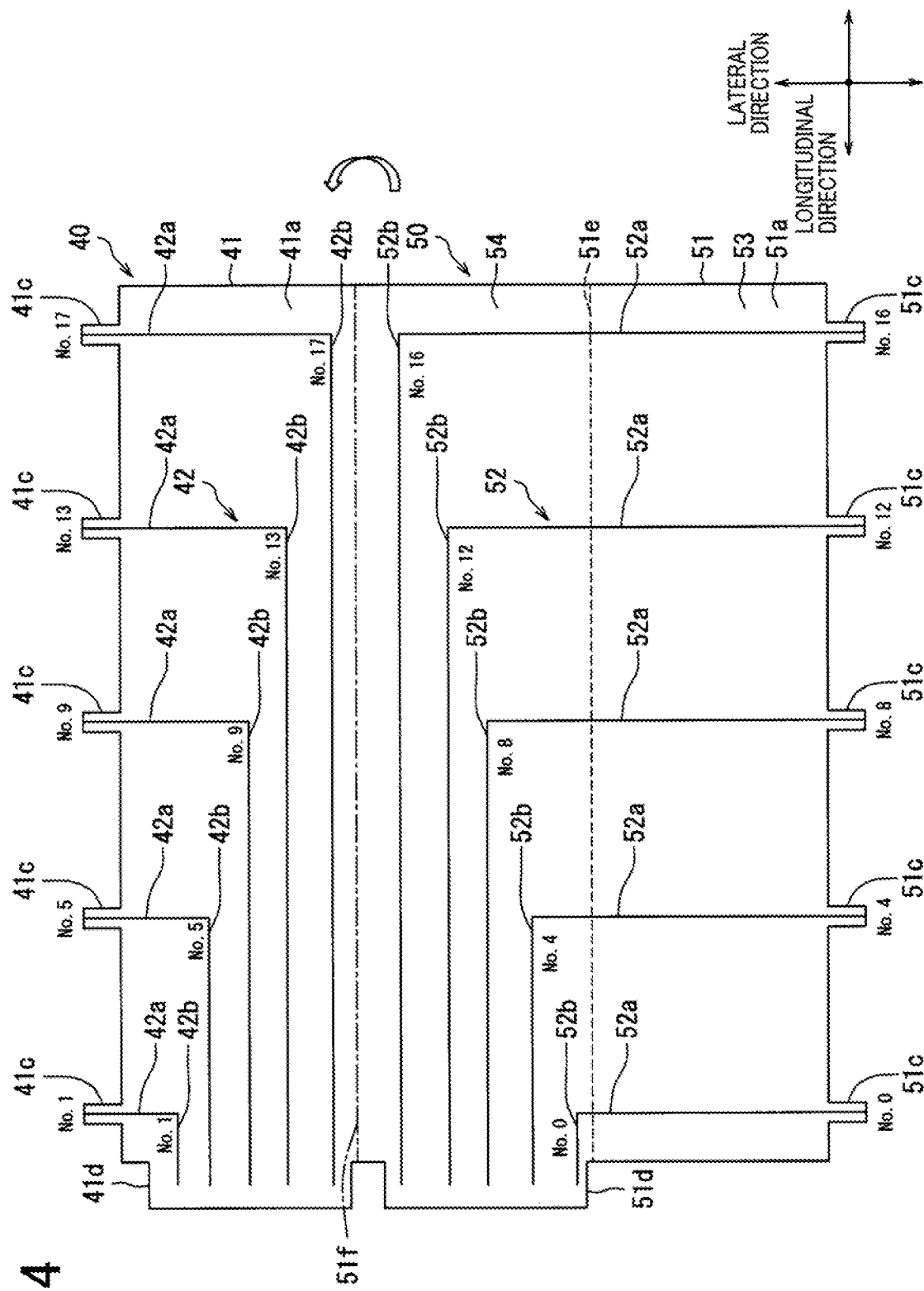
FIG. 14 shows a top view of a wiring section of a second embodiment.

As shown in FIG. 14, a lower side of the first flexible substrate 41 and an upper side of a longitudinal connecting space 54 of the second flexible substrate 51 are integrally connected.

Therefore, in non-bent state shown in FIG. 14, the first flexible substrate 41, the longitudinal connecting space 54, and a lateral connecting space 53 are arranged in order in the lateral direction.

A boundary between the first flexible substrate 41 and the second flexible substrate 51 extends in the longitudinal direction.

As shown by a dashed line in FIG. 14, a second bend line 51f (perforation) for facilitating the bending of the first flexible substrate 41 and the second flexible substrate 51 is formed at a boundary between the first flexible substrate 41 and the second flexible substrate 51.

The second bend line 51f is formed along the longitudinal direction. This second bend line 51f has the same structure as the first bend line 51e.

As shown in FIG. 15, the first flexible substrate 41 and the second flexible substrate 51 are bent in the lateral direction with the second bend line 51f as a center.

By this bending, a front surface 41a of the first flexible substrate 41 and a front surface 51a of the longitudinal connecting space 54 are opposed to each other in the vertical direction.

Further, as shown in FIG. 16, the second flexible substrate 51 is bent in the lateral direction with the first bend line 51e as a center.

By this bending, a back surface 51b of a lateral connecting space 53 and a back surface 51b of a longitudinal connecting space 54 are opposed to each other in the vertical direction.

As described above, similarly to the first embodiment, an arrangement from the upper side to the lower side in the lateral direction of five second longitudinal wirings 52b is arranged from a low potential to a high potential in the same manner as the first longitudinal wiring 42b of the first wiring pattern 42.

Further, since the first flexible substrate 41 and the second flexible substrate 51 are integrally connected, number of parts of a monitoring device 100 is suppressed from increasing.

The monitoring device 100 according to the present embodiment includes the same constituent elements as the monitoring device 100 described in the first embodiment. Therefore, the same functions and effects can be obtained.

Third Embodiment

Next, a third embodiment will be described with reference to FIG. 17.

In the first embodiment, an example is shown in which the boundary between the lateral connecting space 53 and the longitudinal connecting space 54 is along the longitudinal direction.

In contrast, a boundary between a lateral connecting space 53 and a longitudinal connecting space 54 is along the lateral direction in the present embodiment.

As shown in FIG. 17, a lower side of a first flexible substrate 41 and an upper side of the lateral connecting space 53 of a second flexible substrate 51 are integrally connected. A boundary between the first flexible substrate 41 and the lateral connecting space 53 is indicated by a dashed line in FIG. 17.

Further, as shown in FIG. 17, the right side of the first flexible substrate 41 and the right side of the lateral connecting space 53 are integrally connected to the left side of the longitudinal connecting space 54.

A boundary between each of the first flexible substrate 41 and the lateral connecting space 53 and the longitudinal connecting space 54 is along the lateral direction. A first bend line 51e indicated by a broken line is formed at this boundary.

As also shown in FIG. 17, a first projecting portion 41d is positioned on the left side of the first flexible substrate 41. In addition, a second projecting portion 51d is positioned on the right side of the longitudinal connecting space 54.

As a result, the second projecting portion 51d and the first projecting portion 41d are aligned in the longitudinal direction.

Further, in the first embodiment, an example is shown in which the ends of the second lateral wirings 52a extending in the lateral direction and the second longitudinal wirings 52b extending in the longitudinal direction are connected to each other so that the second wiring pattern 52 forms the letter L shape.

On the other hand, a second wiring pattern 52 has connecting wirings 52c connecting second lateral wirings 52a and second longitudinal wirings 52b in the present embodiment.

Ends of the second lateral wirings 52a and ends of the second longitudinal wirings 52b are connected via the connecting wirings 52c. The connecting wire 52c has a letter L shape.

The plurality of first longitudinal wirings 42b are arranged in order from the low potential to the high potential from the upper side to the lower side in the lateral direction. Then, the plurality of second longitudinal wirings 52b are arranged in order from the low potential to the high potential from the upper side to the lower side in the lateral direction.

As shown by broken lines extending in the longitudinal direction in FIG. 17, the second longitudinal wirings 52b are positioned between the plurality of first longitudinal wirings 42b in the lateral direction. Then, the first longitudinal wirings 42b are positioned between the plurality of second longitudinal wirings 52b in the lateral direction.

As a result, the first longitudinal wirings 42b and the second longitudinal wirings 52b are arranged in order of potential from the upper side to the lower side in the lateral direction.

That is, a second longitudinal wiring 52b corresponding to No. 0 negative electrode terminal 222f, a first longitudinal wiring 42b corresponding to No. 1 positive electrode terminal 221, and a second longitudinal wiring 52b corresponding to No. 4 negative electrode terminal 222 are arranged in this order.

Further, a first longitudinal wiring 42b corresponding to No. 5 positive electrode terminal 221, a second longitudinal wiring 52b corresponding to No. 8 negative electrode terminal 222, a first longitudinal wiring 42b corresponding to No. 9 positive electrode terminal 221, and a second longitudinal wiring 52b corresponding to No. 12 negative electrode terminal 222 are arranged in this order.

Furthermore, a first longitudinal wiring 42b corresponding to No. 13 positive electrode terminal 221, a second longitudinal wiring 52b corresponding to No. 16 negative electrode terminal 222, and a first longitudinal wiring 42b corresponding to No. 17 positive electrode terminal 221 are arranged in this order.

The first flexible substrate 41 and the lateral connecting space 53, and the longitudinal connecting space 54 are bent in the longitudinal direction with the first bend line 51e as the center. By this bending, a front surface 41a of the first flexible substrate 41 and a front surface 51a of the longitudinal connecting space 54 are opposed to each other in the vertical direction.

The front surface 51a of the lateral connecting space 53 and the front surface 51a of the longitudinal connecting space 54 are arranged to face each other in the vertical direction.

As a result, as described above, longitudinal wirings corresponding to Nos. 0, 1, 4, 5, 8, 9, 12, 13, 16, and 17 electrode terminals are arranged in order in the lateral direction.

As a matter of course, the front surface 41a of the first flexible substrate 41 and the front surface 51a of the longitudinal connecting space 54, and the front surface 51a of the lateral connecting space 53 and the front surface 51a of the longitudinal connecting space 54 may be bent in the longitudinal direction with the first bend line 51e as the center to be opposed to each other in the vertical direction.

As described above, similarly to the first embodiment, an arrangement from the upper side to the lower side in the lateral direction of the five second longitudinal wirings 52b can be arranged from a low potential to a high potential in the same manner as the five first longitudinal wirings 42b.

Even in a monitoring device 100 according to the present embodiment, the same functions and effects as the monitoring device 100 described in the first embodiment can be obtained.

Fourth Embodiment

Next, a fourth embodiment will be described with reference to FIGS. 18 to 22.

In the first embodiment, an example is shown in which the first wiring section 40 is connected to the back surface 11b of the printed circuit substrate 11 and the second wiring section 50 is connected to the front surface 11a of the printed circuit substrate 11.

On the other hand, in the present embodiment, each of a first wiring section 40 and a second wiring section 50 is connected to a front surface 11a of a printed circuit substrate 11.

In the first embodiment, an example is shown in which the ends of the plurality of first longitudinal wirings 42b are disposed on the first projecting portion 41d extending in the longitudinal direction from the left end portion in the longitudinal direction of the first flexible substrate 41 toward the monitoring section 10.

In addition, an example is shown in which the ends of the plurality of second longitudinal wirings 52b are disposed on the second projecting portion 51d extending in the longitudinal direction from the left end portion in the longitudinal direction of the longitudinal connecting space 54 of the second flexible substrate 51 toward the monitoring section 10.

On the other hand, as shown in FIG. 18, a plurality of third protrusions 41e corresponding to respective ends of a plurality of first longitudinal wirings 42b are formed at the left end portion of a first flexible substrate 41 in the present embodiment.

The plurality of third protrusions 41e are arranged in the lateral direction. The ends of the first longitudinal wirings 42b are disposed on each of the plurality of third protrusions 41e.

As shown in FIGS. 19 and 20, a plurality of fourth protrusions 51g corresponding to ends of a plurality of second longitudinal wirings 52b are formed at the left end portion of the longitudinal connecting space 54.

The plurality of fourth protrusions 51g are arranged in the lateral direction. The ends of the second longitudinal wirings 52b are disposed on each of the plurality of fourth protrusions 51g.

As shown in FIG. 21, when the plurality of third protrusions 41e of the first wiring section 40 are connected to a front surface 11a of a printed circuit substrate 11, spaces are formed between the plurality of third protrusions 41e.

As shown in FIG. 22, the fourth protrusions 51g are connected to the front surface 11a at the spaces between the plurality of third protrusions 41e.

Thereby, the five first longitudinal wirings 42b and the five second longitudinal wirings 52b can be arranged in order of potential on the printed circuit substrate 11.

As a matter of course, the third protrusions 41e and the fourth protrusions 51g may be connected to a back surface 11b of the printed circuit substrate 11.

Even in a monitoring device 100 according to the present embodiment, the same functions and effects as the monitoring device 100 described in the first embodiment can be obtained.

Although preferred embodiments of the present disclosure have been described above, the present disclosure is not limited to the above-described embodiments in any way, and various modifications can be made without departing from the scope of the present disclosure.

First Modification

In the present embodiment, an example is shown in which the battery module 200 has one battery stack 210.

However, the battery module 200 may have a plurality of battery stacks 210.

In this case, storage spaces corresponding to each battery stack 210 are formed in a casing of the battery module 200. These storage spaces are disposed side by side in the lateral direction.

When battery cells 220 of two battery stacks 210 are connected in series, for example, the two battery stacks 210 have the same even number of battery cells 220.

A negative terminal 222 of a battery cell 220 positioned on the right side of one of the two battery stacks 210 and a positive terminal 221 of a battery cell 220 positioned on the right side of the other one of the two battery stacks 210 are electrically connected.

As a result, a positive terminal 221 of a battery cell 220 positioned on the left side of one of the two battery stacks 210 becomes the highest potential, and a negative terminal 222 of a battery cell 220 positioned on the left side of the other one of the two battery stacks 210 becomes the lowest potential.

The positive electrode terminal 221 of the highest potential and the negative electrode terminal 222 of the lowest potential are arranged side by side in the lateral direction.

Other Modifications

In each embodiment, an example is shown in which the battery pack 400 is applied to a hybrid vehicle.

However, the battery pack 400 can also be applied to, for example, plug-in hybrid vehicles and electric vehicles.

In each embodiment, an example is shown in which the first wiring section 40 has the first flexible substrate 41.

However, when it is not necessary to bend the first flexible substrate 41, the first flexible substrate 41 may not necessarily have flexibility.

A printed circuit substrate having lower flexibility than the second flexible substrate 51 can be adopted as the first flexible substrate 41.

What is claimed is:

1. A monitoring device comprising:
   a monitoring section that monitors voltages of a plurality of battery cells connected in series in a longitudinal direction, and
   a wiring section for electrically connecting the monitoring section and the battery cells, wherein
   each of the plurality of battery cells has a positive electrode terminal and a negative electrode terminal, a first electrode terminal group in which the positive electrode terminals and the negative electrode terminals are alternately arranged by arranging the positive electrode terminals and the negative electrode terminals alternately in the longitudinal direction, and a second electrode terminal group in which an arrangement of the positive electrode terminals and the negative electrode terminals are reversed with respect to the first electrode terminal group,
   the wiring section includes a first wiring section that electrically connects the first electrode terminal group and the monitoring section, and a second wiring section that electrically connects the second electrode terminal group and the monitoring section,
   the first wiring section includes a first substrate and a first wiring pattern formed on the first substrate, the second wiring section includes a second substrate and a second wiring pattern formed on the second substrate, the second substrate includes a lateral connecting space where a first end of the second wiring pattern is disposed and a longitudinal connecting space where a second end of the second wiring pattern is disposed, and the second substrate is bent such that portions of the lateral connecting space and the longitudinal connecting space are opposed to each other.

2. The monitoring device according to claim 1, wherein the second substrate is bent around a boundary between the lateral connecting space and the longitudinal connecting space, and the boundary between the lateral connecting space and the longitudinal connecting space extends in the longitudinal direction.

3. The monitoring device according to claim 1, wherein the second substrate is bent around a boundary between the lateral connecting space and the longitudinal connecting space that extends in the longitudinal direction, and the boundary between the lateral connecting space and the longitudinal connecting space has a width in a lateral direction in which the first electrode terminal group and the second electrode terminal group are arranged.

4. The monitoring device according to claim 1, wherein the second substrate has front and back surfaces;

the second wiring pattern is on the front surface; and the second substrate is bent such that the back surface has opposing portions.

5. The monitoring device according to claim 1, wherein the wiring section includes a connecting part that maintains a bent state of the second substrate by mechanically connecting the lateral connecting space and the longitudinal connecting space.

6. The monitoring device according to claim 5, wherein the connecting part maintains the bent state of the second substrate such that a clearance between the lateral connecting space and the longitudinal connecting space is wider than a thickness of the second substrate.

7. The monitoring device according to claim 1, wherein the second substrate is formed with intermittent notches at a boundary between the lateral connecting space and the longitudinal connecting space such that the second substrate has alternating first and second thicknesses along the boundary.

8. The monitoring device according to claim 7, wherein the second wiring pattern traverses the boundary between the lateral connecting space and the longitudinal connecting space, and a width of a portion of the second wiring pattern in the boundary wider than any notch of the intermittent notches.

9. The monitoring device according to claim 1, wherein the first substrate and the second substrate are integrally connected to each other and are bent around a boundary between the second substrate and the first substrate.

10. The monitoring device according to claim 1, wherein the first end of the second wiring pattern is electrically connected to the second electrode terminal group and the second end of the second wiring pattern is electrically connected to a front surface of the monitoring section, the first wiring pattern has first and second ends, and the first end of the first wiring pattern is electrically connected to the first electrode terminal group and the second end of the first wiring pattern is electrically connected to a back surface of the monitoring section.

* * * * *